United States Patent
Salaverry et al.

(10) Patent No.: US 9,256,327 B2
(45) Date of Patent: Feb. 9, 2016

(54) SYSTEM AND METHOD FOR DETECTING LOCATIONS OF TOUCHES ON A TOUCH SENSOR

(75) Inventors: Ricardo R. Salaverry, San Jose, CA (US); James G. Quaderer, Sunnyvale, CA (US); Francis Lau, Fremont, CA (US); Joel C. Kent, Fremont, CA (US)

(73) Assignee: Elo Touch Solutions, Inc., Milpitas, CA (US)

( * ) Notice: Subject to any disclaimer, the term of this patent is extended or adjusted under 35 U.S.C. 154(b) by 670 days.

(21) Appl. No.: 13/107,565

(22) Filed: May 13, 2011

(65) Prior Publication Data

US 2011/0279409 A1 Nov. 17, 2011

Related U.S. Application Data

(63) Continuation-in-part of application No. 12/780,077, filed on May 14, 2010.

(51) Int. Cl.
| | |
|---|---|
| G06F 3/044 | (2006.01) |
| G06F 3/041 | (2006.01) |
| G01R 27/26 | (2006.01) |

(52) U.S. Cl.
CPC ............. *G06F 3/044* (2013.01); *G06F 3/0416* (2013.01); *G01R 27/2605* (2013.01); *G06F 2203/04104* (2013.01); *G06F 2203/04107* (2013.01);
(Continued)

(58) Field of Classification Search
CPC ............................ G01R 27/2605; G06F 3/044
See application file for complete search history.

(56) References Cited

U.S. PATENT DOCUMENTS

| | | |
|---|---|---|
| 3,573,755 A | 4/1971 | Ellis et al. |
| 3,697,687 A | 10/1972 | Larson et al. |

(Continued)

FOREIGN PATENT DOCUMENTS

| | | |
|---|---|---|
| CN | 101535933 A | 9/2009 |
| CN | 101566895 A | 10/2009 |

(Continued)

OTHER PUBLICATIONS

International Search Report and Written Opinion for PCT/US2011/036492.

(Continued)

*Primary Examiner* — Jeff Natalini
(74) *Attorney, Agent, or Firm* — Sterne, Kessler, Goldstein & Fox PLLC

(57) ABSTRACT

A projected capacitive touch sensor system includes a substrate that defines a plurality of non-overlapping areas. Each non-overlapping area includes a plurality of detection electrodes arranged in non-overlapping columns. The columns include a horizontal detection electrode that extends along substantially an entire height of a first column, and at least a second column of at least two vertical detection electrodes that are electrically isolated from one another. The system further includes a measuring circuit configured to measure a mutual capacitance between the horizontal detection electrode and each of the at least two vertical detection electrodes in a given area. A processing logic circuit of the system is configured to determine horizontal detection electrode and vertical detection electrode combinations that have a changed mutual capacitance. The processing logic is also configured to determine the touch location based on a location of the determined horizontal detection electrode and vertical electrode combinations.

29 Claims, 22 Drawing Sheets

(52) U.S. Cl.
CPC ............... *G06F2203/04108* (2013.01); *G06F 2203/04112* (2013.01)

(56) References Cited

U.S. PATENT DOCUMENTS

| | | | |
|---|---|---|---|
| 4,087,625 A | | 5/1978 | Dym et al. |
| 4,504,832 A | | 3/1985 | Conte |
| 5,053,757 A | * | 10/1991 | Meadows ..................... 345/173 |
| 5,305,017 A | | 4/1994 | Gerpheide |
| 5,327,164 A | | 7/1994 | Fagard et al. |
| 6,288,707 B1 | | 9/2001 | Philipp |
| 6,297,811 B1 | | 10/2001 | Kent et al. |
| 6,879,930 B2 | | 4/2005 | Sinclair et al. |
| 7,196,358 B1 | | 3/2007 | Chen |
| 7,218,124 B1 | | 5/2007 | Mackey et al. |
| 7,382,139 B2 | | 6/2008 | Mackey |
| 7,439,962 B2 | | 10/2008 | Reynolds et al. |
| 7,567,240 B2 | | 7/2009 | Peterson, Jr. et al. |
| 2003/0067451 A1 | | 4/2003 | Tagg et al. |
| 2005/0184965 A1 | | 8/2005 | Geaghan et al. |
| 2005/0247559 A1 | | 11/2005 | Frey et al. |
| 2005/0270273 A1 | | 12/2005 | Marten |
| 2006/0274055 A1 | * | 12/2006 | Reynolds et al. ............. 345/174 |
| 2006/0279548 A1 | | 12/2006 | Geaghan |
| 2007/0052690 A1 | | 3/2007 | Roberts |
| 2007/0132724 A1 | | 6/2007 | Muranaka |
| 2007/0257894 A1 | | 11/2007 | Philipp |
| 2008/0111795 A1 | | 5/2008 | Bollinger |
| 2008/0158167 A1 | | 7/2008 | Hotelling et al. |
| 2008/0265914 A1 | | 10/2008 | Matsushima |
| 2009/0135146 A1 | | 5/2009 | Scholz |
| 2009/0194344 A1 | | 8/2009 | Harley et al. |
| 2009/0237374 A1 | | 9/2009 | Li et al. |
| 2009/0267914 A1 | | 10/2009 | Dews et al. |
| 2009/0314621 A1 | | 12/2009 | Hotelling |
| 2010/0001973 A1 | | 1/2010 | Hotelling et al. |
| 2010/0090979 A1 | | 4/2010 | Bae |
| 2010/0110038 A1 | * | 5/2010 | Mo et al. ..................... 345/174 |
| 2010/0149108 A1 | * | 6/2010 | Hotelling et al. ............. 345/173 |
| 2010/0188345 A1 | * | 7/2010 | Keskin et al. ................. 345/173 |
| 2010/0328265 A1 | | 12/2010 | Hotelling et al. |
| 2011/0057669 A1 | * | 3/2011 | Xu ............................... 324/658 |
| 2011/0210934 A1 | | 9/2011 | Lee et al. |
| 2011/0279169 A1 | | 11/2011 | Salaverry |
| 2011/0279408 A1 | * | 11/2011 | Urano et al. .................. 345/174 |

FOREIGN PATENT DOCUMENTS

| | | |
|---|---|---|
| CN | 101632060 A | 1/2010 |
| CN | 102226883 A | 10/2011 |
| EP | 2045698 A2 | 4/2009 |
| KR | 2008-0104108 A | 12/2008 |
| TW | 200837622 | 9/2008 |

OTHER PUBLICATIONS

Office Action directed to related Taiwanese Patent Application No. 100116795, mailed Jul. 30, 2014; 21 pages.

Non-Final Office Action for U.S. Appl. No. 12/780,077, mailed Jun. 20, 2012; 13 pages.

Final Office Action for U.S. Appl. No. 12/780,077, mailed Feb. 13, 2013; 15 pages.

Non-Final Office Action for U.S. Appl. No. 12/780,077, mailed Jul. 24, 2014; 14 pages.

Final Office Action for U.S. Appl. No. 12/780,077, mailed Oct. 24, 2014; 15 pages.

Office Action directed to related Chinese Patent Application No. 201180034483.1, mailed Jan. 27, 2015; 9 pages.

English-language Abstract of Chinese Patent Application Publication No. 101535933 A; 1 page.

Office Action directed to related Chinese Patent Application No. 201180034483.1, with attached English-language translation, mailed Sep. 7, 2015; 10 pages.

* cited by examiner

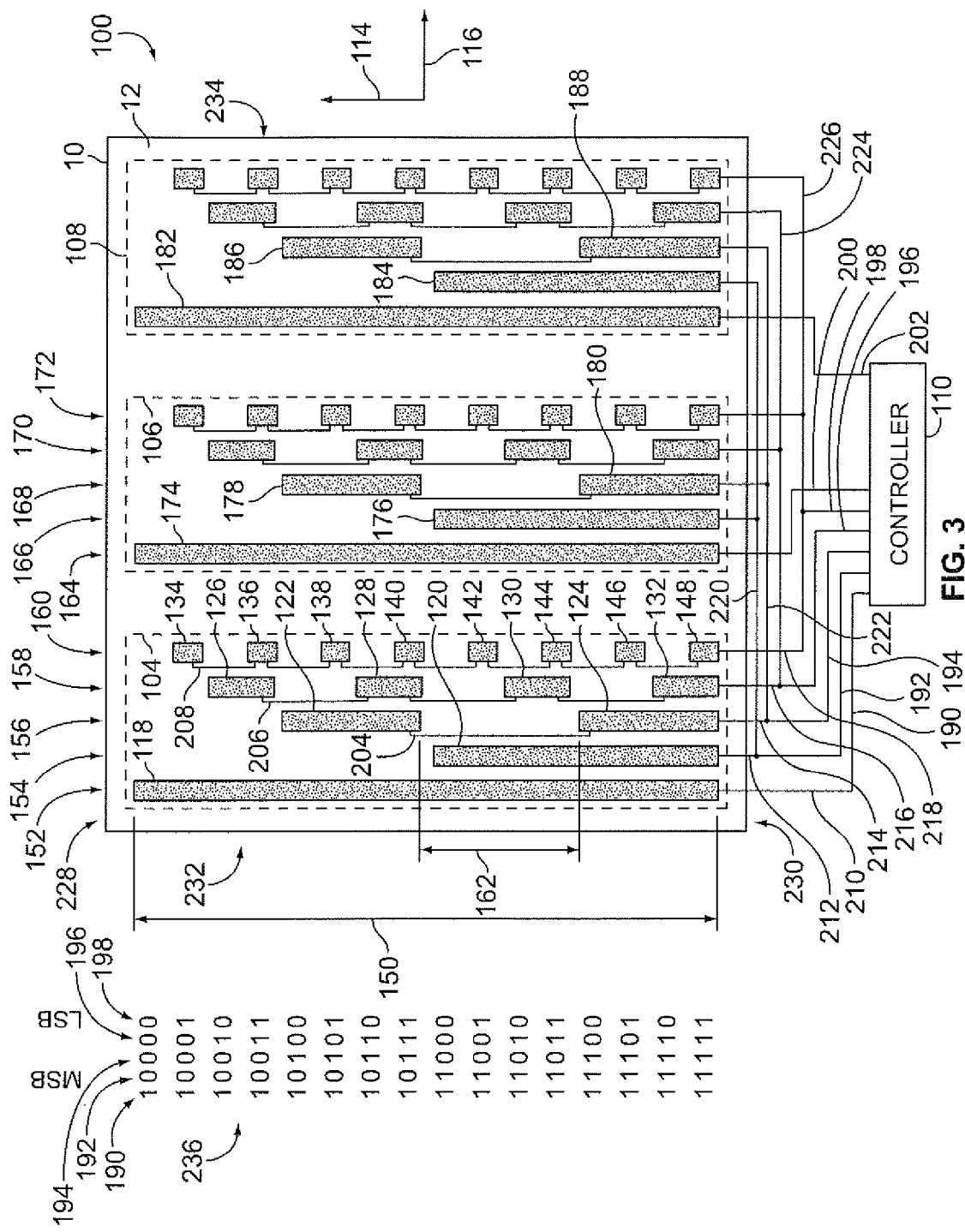

SYSTEM AND METHOD FOR DETECTING LOCATIONS OF TOUCHES ON A TOUCH SENSOR

RELATED APPLICATIONS

This application is a continuation-in-part application of U.S. application Ser. No. 12/780,077, filed May 14, 2010, the contents of which are hereby incorporated by reference.

BACKGROUND OF THE INVENTION

The subject matter disclosed herein relates generally to touch sensors and touch sensor systems, and more particularly to projected capacitive touch sensors.

In a projected capacitive touch sensor, an outer surface may be provided over one or more layers having sense electrodes or sensors formed thereon. In contrast to common resistive touch sensors, the outer surface of a projected capacitive touch sensor may be a durable glass surface having high optical transparency for viewing images displayed by an underlying display device. The touch sensor may be positioned over a display device that displays graphical selections such as buttons and icons. When a user's finger touches the outer surface at a location corresponding to a desired selection displayed on the display device, the touch sensor system senses a change in capacitance associated with one or more of the electrodes. As used herein, a "projected capacitive" touch sensor is any capacitive touch sensor with a plurality of detection electrodes in the touch sensitive area, in contrast to a "surface capacitive" touch sensor that has a single detection electrode that covers the entire touch area.

Some projected capacitive touch sensors detect where a touch is located by measuring capacitance and then calculating (X,Y) coordinates. These detection algorithms may not yield accurate results in electrically noisy environments.

Each touch on the projected capacitive touch sensor is typically detected by at least two electrodes. The number of electrodes may vary depending on the size of the screen as well as the resolution desired.

For example, one type of a projected capacitive touch sensor system may have two electrode layers: a first electrode layer having parallel linear electrodes in a first direction and a second separate electrode layer having parallel linear electrodes in a direction perpendicular to the first direction, where the second electrode layer overlaps the first electrode layer. A virtue of such two electrode layer systems that have proven to be of interest to the marketplace is the ability to support two or more simultaneous touches as is used in two-finger zoom gestures. While being expensive to manufacture with its multiple electrode layers, this type of projected capacitive touch sensor system has the advantage of experiencing only modest coordinate distortions in the presence of electrical noise. The calculation of coordinates of a touch based on measured capacitance is susceptible to electrical noise. For instance, a 5% noise level may distort a coordinate measurement by about 5% of the width of a finger touch for this type of two-layer projected capacitive touch sensor. This level of distortion may be unacceptable for certain applications of the touch sensor.

Another type of a projected capacitive touch sensor system may have a "backgammon"-type electrode pattern configuration on a single layer containing two interleaved sets of generally triangular electrodes: one set ("set 1") with triangles pointing in one direction (e.g., up) and the other set ("set 2") with triangles pointing in the opposite direction (e.g., down), such as described in U.S. Pat. No. 6,297,811, which is incorporated herein by reference in its entirety. For such a backgammon-type system having a 3.5 inch diagonal measurement, the touch sensor may utilize close to fifty separate triangular-shaped electrodes on the single layer, and a seven-inch system may have more than one hundred electrodes. The single layer backgammon-type electrode configuration can provide multiple touch capability when pairs of touches excite disjoint sets of triangular-shaped electrodes, but has difficulty when the sets of excited electrodes from two simultaneous touches are not disjoint. For example if the triangular-shaped electrodes are aligned horizontally, detection of a pair of touches with similar vertical coordinates is problematic. Using a backgammon-type electrode configuration, the touch sensor may calculate two-dimensional coordinates after measuring capacitances from a single electrode layer, but unfortunately may be quite susceptible to electrical noise, which may negatively impact the determination of coordinates. For example, a 5% noise level may distort a coordinate (e.g. Y coordinate) measurement by 5% of the entire height of the touch area, which may be unacceptable for many touch applications.

With such concerns due to the low noise level requirements, the electronics required for these conventional projected capacitive touch sensor systems may drive the overall system production costs up, especially for larger touch sensor systems.

Accordingly, there is a need for low cost and higher noise-tolerant electrode touch sensor systems, such as projected capacitive touch systems, capable of detecting two or more simultaneous touches.

BRIEF DESCRIPTION OF THE INVENTION

In one embodiment, a method for determining a touch location of a projected capacitive touch sensor includes providing a substrate that defines a plurality of non-overlapping areas. Each non-overlapping area includes a plurality of detection electrodes arranged in non-overlapping columns. The electrode columns include a horizontal detection electrode that extends along substantially an entire height of a first column, a second column of at least two vertical detection electrodes that are electrically isolated from one another, and a third column of at least two vertical detection electrodes formed of at least three electrode portions. The vertical detection electrodes in different columns are electrically isolated from one another, and two vertical electrode portions separated by the third vertical electrode portion in the third column are electrically connected. The method further includes measuring a mutual capacitance between the horizontal detection electrode and each of the at least two vertical detection electrodes in the second column, and between the horizontal detection electrode and each of the at least two vertical detection electrodes in the third column. Horizontal detection electrode and vertical detection electrode combinations that have a changed mutual capacitance are determined. Then a touch location is determined based on a location of the determined horizontal detection electrode and vertical electrode combinations.

In another embodiment, a touch sensor system includes a substrate that defines a plurality of non-overlapping areas. Each non-overlapping area includes a plurality of detection electrodes arranged in non-overlapping columns. The columns include a horizontal detection electrode that extends along substantially an entire height of a first column, and at least a second column of at least two vertical detection electrodes that are electrically isolated from one another. The system further includes a measuring circuit configured to measure a mutual impedance between the horizontal detection electrode and each of the at least two vertical detection electrodes in a given area. A processing logic circuit of the system is configured to determine horizontal detection electrode and vertical detection electrode combinations that have a changed mutual impedance. The processing logic is also configured to determine the touch location based on a location of the determined horizontal detection electrode and vertical electrode combinations.

In yet another embodiment, a touch sensor system includes a substrate that defines a plurality of non-overlapping areas. Each non-overlapping area includes a plurality of detection electrodes. The plurality of detection electrodes include a horizontal detection electrode that extends along substantially an entire height of an area. The electrodes also include P pairs of vertical detection electrodes. The vertical detection electrodes are electrically isolated from one another. P is at least 2 and the P pairs of vertical detection electrodes define $2^P$ non-overlapping vertical detection zones in the area.

BRIEF DESCRIPTION OF THE DRAWINGS

FIG. 3 illustrates a touch sensor formed in accordance with an embodiment of the present invention that is connected to a controller.

DETAILED DESCRIPTION OF SPECIFIC EMBODIMENTS OF THE INVENTION

Figure 1:
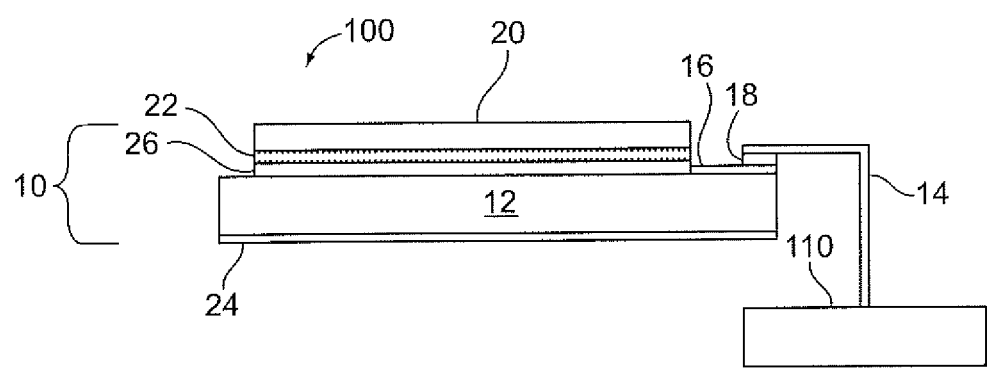
FIG. 1 illustrates a side-view of a projected capacitive touch sensor system formed in accordance with an embodiment of the present invention.

The foregoing summary, as well as the following detailed description of certain embodiments of the present invention, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like). Similarly, the programs may be stand alone programs, may be incorporated as subroutines in an operating system, may be functions in an installed software package, and the like. It should be understood that the various embodiments are not necessarily drawn to scale or limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

FIG. 1 generally illustrates a side-view of a projected capacitive touch sensor 10 that may be used within a touch sensor system 100, according to a specific embodiment of the invention. A plurality of electrodes 26 on a single layer are attached to substrate 12 and may be coupled to a flexible cable 14 via interconnect traces 16, which may be metalized or other conductive traces, and a conductive adhesive bond 18, which may be an anisotropic conductive film (ACF). For example, termination pads within the interconnect traces 16 may be electrically connected to termination pads within the flexible cable 14 via an anisotropic conductive film. The flexible cable 14 is also coupled to the touch sensor electronics or a controller 110, which controls the driving and sensing of the electrodes as well as determining touch coordinates based on the sensed touch or touches to the sensor. A durable transparent layer of glass, polycarbonate or other suitable material forming touch surface 20 may be mechanically coupled to the electrodes 26, such as with an adhesive layer 22. The capacitance change resulting from a finger(s) touching the touch surface 20 can be measured and associated touch coordinates determined.

In one embodiment, a shield or guard electrode 24 may optionally be deposited on a bottom surface of the substrate 12, around an outer edge of the substrate 12, and/or formed in the same plane or surface of the substrate 12 as the electrodes 26. The guard electrode 24 may be used to minimize the effects of stray capacitances to objects around the perimeter of the touch sensor 10, such as metal associated with a bezel, other supporting structures or a display device placed behind the touch sensor 10 (all not shown), and to minimize the effects of stray capacitances between the electrodes 26. Alternatively, guard electrode 24, adhesive layer 22 and touch surface 20 may be absent and detection electrodes 26 may be used to detect touches that are applied to the surface of the substrate 12 that is opposite to the electrodes 26. In some embodiments, the touch sensor 10 may be separate from a display, and thus substrate 12 and electrodes 26 may be opaque or semi-opaque.

FIGS. 2(*a*) and 2(*b*) illustrate a top surface 68 showing the general configuration of electrodes 26 on a single layer of a touch sensor 50, according to a specific embodiment of the invention. The top surface 68 may be a top surface of the substrate 12. In the specific example of FIG. 2(*b*), for description purposes there are four areas 70-76 but different embodiments may have fewer or more than four areas (such as seen in the example of FIG. 2(*a*), where there are many more than four areas and a touch (shown by a circle) is made on multiple horizontal detection electrodes and on more than one area. For simplicity, the description will be provided in connection with FIG. 2(*b*). As seen in FIG. 2(*b*), which could be an expanded partial view compared to FIG. 2(*a*), the touch sensor 50 may be divided into a plurality of areas 70-76 that each includes at least one horizontal detection electrode and a plurality of vertical detection electrodes. In some embodiments, signal levels associated with the horizontal detection electrodes are used to identify the horizontal location of a touch on the touch sensor 50. The signal levels associated with the vertical detection electrodes are used to identify the vertical location of the touch in conjunction with the horizontal location that is determined based on measurements of the horizontal detection electrode(s). In one embodiment, each of the areas 70, 72, 74, and 76 includes one horizontal detection electrode 52, 54, 56 and 58, respectively, wherein each of the horizontal detection electrodes 52-58 is connected to a different electronic channel as discussed below. In other embodiments, more than one horizontal detection electrode 52-58 may be connected to a single electronic channel. Rectangular blocks 60, 62, 64 and 66 generally indicate areas that include a plurality of vertical detection electrodes wherein the vertical detection electrodes in one block 60 are connected to the vertical detection electrodes that are located within the same general position in the other area blocks 62-66. Electrode patterns within the different blocks 60-66 may be the same electrode pattern or a combination of different electrode patterns. Although a plurality of different electrode patterns are discussed herein, it should be understood that other electrode patterns are also contemplated. The numbers of electronic channels used to sense the vertical detection electrodes may be based on the number of vertical detection electrodes, precision desired, electrode pattern, and the like. It is noted that in FIG. 2(*a*), the areas (70, 72, 74, 76 . . . ) are not labeled, but instead horizontal detection electrodes (52, 54, 56, 58 . . . ) and blocks (60, 62, 64, 66 . . . ) are generally shown.

FIG. 3 illustrates a projected capacitive touch sensor 10 that may be used within a touch sensor system 100, according to a specific embodiment. The touch sensor 10 has sets of electrodes coupled to corresponding areas on a surface of the substrate 12, wherein each set of electrodes includes a horizontal detection electrode and a plurality of vertical detection electrodes. For illustration and discussion purposes, first, second and third areas 104, 106 and 108 are shown. The areas 104-108 are non-overlapping and located within the same plane. Although not shown, the areas 104-108 may be immediately adjacent, similar to FIGS. 2(*a*) and 2(*b*), wherein all of the touch surface area of the substrate 12 is covered by an area. It should be understood that the touch sensor 10 may have more than the three areas shown in FIG. 3. Although the areas 104-108 are shown as rectangular and extending along the entirety of one dimension of the usable touch area of the touch sensor 10, it should be understood that the areas 104-108 may be other shapes and dimensions.

The substrate 12 may be glass, a polymer film such as polyethylene terephthalate (PET), a metal such as aluminum, or other suitable material. The electrodes are formed on the substrate 12. Some of the electrodes may be substantially square in shape while some electrodes may be rectangular. It should be understood that other shapes may be used. There is no overlap of individual electrodes and all of the electrodes may be formed on a single plane or surface, such as the top surface, of the substrate 12. In the embodiment shown, the sets of electrodes form the same electrode pattern within each of the areas 104-108. In other embodiments the sets of electrodes may not form the same electrode pattern within each of the areas 104-108 and may form the same electrode pattern within a subset of the areas 104-108.

The electrodes may be fabricated as a conductive film covering the entirety of the electrode area, a conductive film that incompletely fills the area such as with a mesh pattern, a serpentine pattern or other pattern. For example, an electrode may be formed of more than one area of conductive film located close together and electrically connected to each other. Each of the electrodes may be formed of a continuous loop of a conductive material, such as by forming a serpentine pattern using fine metal wires to fill in an outline of each electrode. The wires may be, for example, between ten and twenty-five micrometers thick. In another embodiment, the electrodes may be formed from a deposited conductive coating that may be deposited in a desired pattern, such as by using screen printing, photographic, or other process. The conductive coating may be indium tin oxide (ITO), antimony tin oxide (ATO), a fluorine-doped tin oxide, a carbon-nanotube containing film, a silver nano-wire containing film, an intrinsically conductive polymer, and the like.

The touch sensor 10 has a Y or vertical axis 114 and an X or horizontal axis 116. Designators top 228, bottom 230, left 232 and right 234 are given with respect to the touch sensor 10 for reference only. Referring to the first area 104, the set of electrodes includes horizontal detection electrode 118 and vertical detection electrodes 120-148. Horizontal detection electrode 118 extends along a height 150 of a column 152 within the first area 104. In some embodiments, the height 150 of the column 152 corresponds to the height of the first area 104 along the vertical axis 114 and may also correspond to the height of the usable touch area of the touch sensor 10. Vertical detection electrode 120 extends partially along the height 150 of another column 154. Vertical detection electrodes 122 and 124 extend partially along the height 150 of column 156 and are physically separate with respect to each other. Gap 162 separates the vertical detection electrodes 122 and 124. Vertical detection electrodes 126, 128, 130 and 132 extend partially along the height 150 of column 158 and are physically separate with respect to each other. Vertical detection electrodes 134, 136, 138, 140, 142, 144, 146 and 148 extend partially along the height 150 of the column 160 and are physically separate with respect to each other. Electrodes that are physically separate with respect to each other, such as being separated by a gap and/or another electrode, may be electrically connected together via, for example, a trace. Additionally, the electrodes are not limited to the illustrated column arrangement. For example, column 152 may be located at any column location within the first area 104. Similarly, columns 154-160 may be located in any order. The order of the columns in any other electrode pattern discussed herein may be similarly arranged in any order. Also, more columns of horizontal detection electrodes and more or less columns of vertical detection electrodes may be used.

According to a specific embodiment, the set of electrodes in the second area 106 forms the same pattern as within the first area 104. The electrodes are formed in columns 164-172 in area 106. Horizontal detection electrode 174 extends along column 164 while vertical detection electrodes extend partially along columns 166, 168, 170 and 172. Vertical detection electrodes in the first area 104 correspond to vertical detection electrodes of the second and third areas 106 and 108 that are located in the same relative column and in substantially the same position along the vertical axis 114. For example, vertical detection electrode 120 in area 104 corresponds to vertical detection electrode 176 in area 106; vertical detection electrodes 122 and 124 in area 104 correspond to vertical detection electrodes 178 and 180 in area 106, respectively; and so on. Not all of the electrodes are given separate item numbers. In one embodiment, electrodes in one area may correspond to electrodes in another area that are not located in the same relative position.

For clarity, the electrode pattern shown in FIG. 3 may not be to scale. For example, the areas 104-108 may be positioned closer together with less open space between them. In one embodiment, each column 152-160 and 164-172 may be spaced equidistant from neighboring columns, regardless of which area the column is in. For example, columns 158 and 160 may be separated by the same distance as columns 160 and 164. Additionally, the dimensions of the electrodes may be different than illustrated. In one embodiment, the first area 104 may be five millimeters (mm) in width along the horizontal axis 116. In another embodiment, a left side of the horizontal detection electrode 118 may be spaced five mm from a left side of the horizontal detection electrode 174. Also, the height of the vertical detection electrode 134 along the vertical axis 114 may be five mm. It should be understood that other dimensions may be used.

The controller 110 provides a predetermined number of capacitance measuring electronic channels, such as twelve electronic channels. One or more electrodes may be attached to each of the electronic channels. In one embodiment, horizontal detection electrode 118 is the only electrode connected to electronic channel 190, horizontal detection electrode 174 is the only electrode connected to electronic channel 200, and horizontal detection electrode 182 from within the third area 108 is the only electrode connected to electronic channel 202. In one embodiment, vertical detection electrodes in one area are electrically connected to corresponding vertical detection electrodes within different areas or sets of electrodes, and to the same electronic channel. For example, vertical detection electrodes 120, 176 and 184 are electrically connected together and to electronic channel 192. Vertical detection electrodes 122, 124, 178, 180, 186 and 188 are also electrically connected together and to electronic channel 194. Similarly, vertical detection electrodes 126-132 are electrically connected to corresponding electrodes within the second and third areas 106 and 108 and to electronic channel 196. Vertical detection electrodes 134-148 are electrically connected to corresponding electrodes within the second and third areas 106 and 108 and to electronic channel 198.

In one embodiment, traces 204, 206, 208, 210, 212, 214, 216, 218, 220, 222, 224 and 226 (not all traces are indicated with item numbers) may be formed from materials such as the conductive wire, silver-frit, deposited metal films, conductive-ink, incomplete deletion-line separation of the conductive coating, and the like, to electrically connect electrodes on the substrate 12. The traces 204-226 may also convey signals and power between individual or multiple electrodes and a cable or cable connector (as shown in FIG. 1). In some embodiments the corresponding electrodes may be electrically connected to each other on the substrate 12, while in other embodiments the corresponding electrodes may be electrically connected to each other within the flexible cable or controller 110 or any combination thereof.

As shown, the configuration of FIG. 3 would utilize seven electronic channels 190-202, reducing the required number of electronic channels compared to a system that connects each electrode to a separate electronic channel or that assigns electrodes within same areas to a set number of channels. In addition, effects of electronic noise may be reduced because the scan speed may be increased, providing more individual measurements for noise suppression via signal averaging within a given period of time for each electronic channel. It should be understood that different numbers of electronic channels may be used to include more electrodes (not shown), accommodate more areas, and/or provide for a larger-sized touch sensor 10, according to other specific embodiments.

The electronic channels may be provided within an integrated circuit that may be provided on a separate chip (not shown) within controller 110. Additional chips may be included within the controller 110 to provide additional electronic channels.

The electrodes couple capacitively to finger (or to other sufficiently conductive object) contact that overlaps at least a portion of the electrode, and the controller 110 detects signal levels associated with a touch on the substrate 12 or other touch surface (e.g., touch surface 20 of FIG. 1). For example, a touch increases the level of capacitance associated with the electrodes that are under the touch area. The amount of signal that is generated depends on at least the overall size of the touch and a thickness (and dielectric constant) of the touch surface used. A thicker touch surface may result in a larger sensed touch area due to lateral spreading of electric field lines going from the finger (or other object) to the electrodes 118-148 and 174-188.

Figure 4:
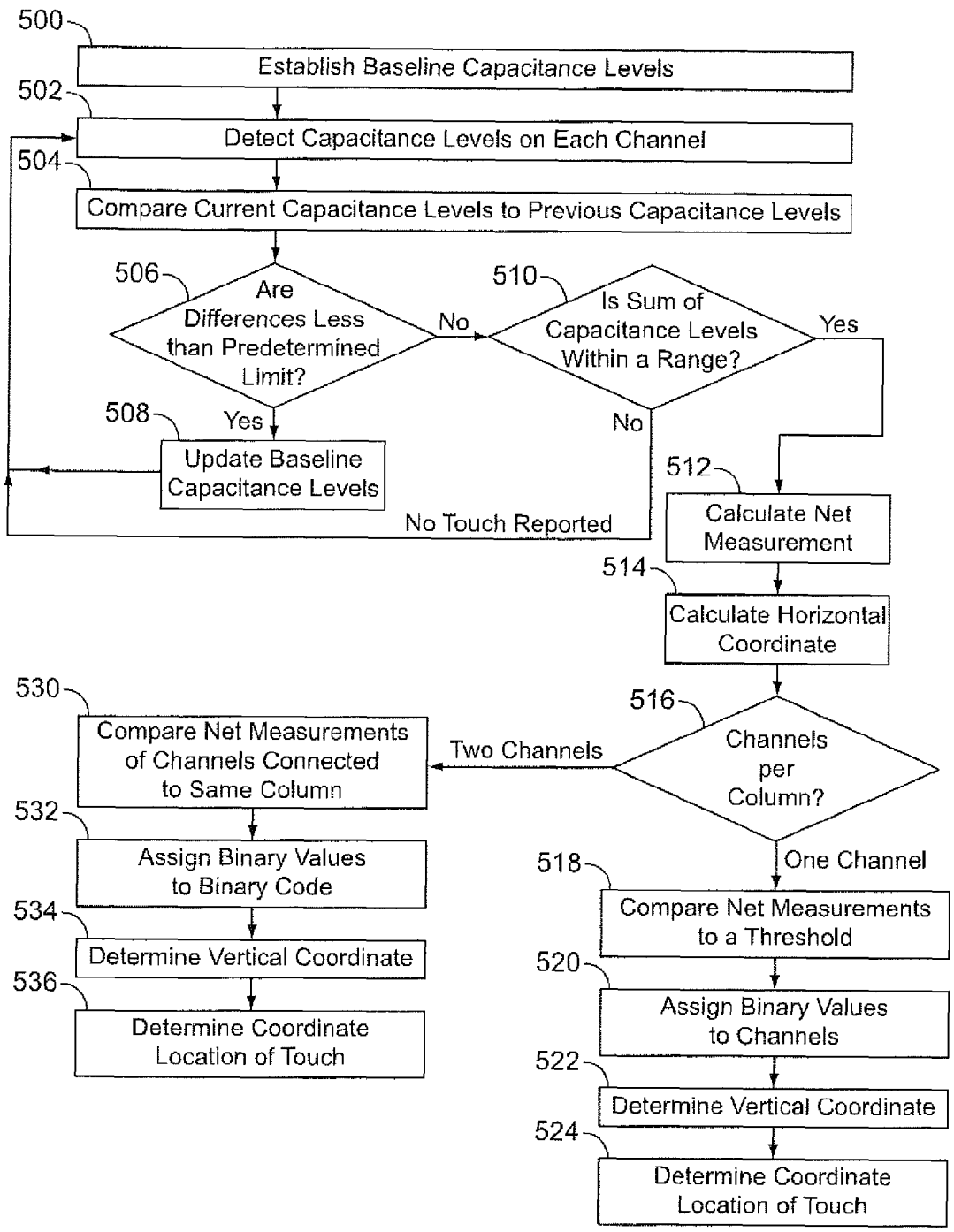
FIG. 4 illustrates a method for determining locations of touches on the touch sensor in accordance with an embodiment of the present invention.

FIG. 4 is a flow chart illustrating a method for determining coordinate locations of a touch on the touch sensor 10, according to a specific embodiment. At 500 the controller 110 establishes a baseline capacitance level for each electronic channel. This may be accomplished when the system 100 is initially powered on and no touch is present on the touch sensor 10. There may be predetermined limits within which the baseline capacitance levels are considered to be valid. In some embodiments, other adjustments may be accomplished, such as to correct for effects such as the finite resistance of ITO.

Referring also to FIG. 3, at 502 the controller 110 detects capacitance levels on each electronic channel 190-202. In one embodiment, the capacitance level may be a signal amplitude. At 504, the controller 110 compares the current capacitance levels to previously detected capacitance levels for the same channel. For example, the capacitance level detected on electronic channel 190 would be compared to the previously detected capacitance level on electronic channel 190, which may initially be the baseline. At 506 the controller 110 determines whether the differences are less than a predetermined limit. If yes, at 508 the controller 110 updates the baseline capacitance levels based on the most current detected capacitance levels. In one embodiment, the baseline may be changed to be equal to the most current detected capacitance levels, while in another embodiment, the baseline may be changed, such as with a recursive filter, based on the difference. The method returns from 508 to 502 to generate a dynamic baseline that may change over time.

Returning to 506, if the controller 110 determines that at least a portion of the electronic channels 190-202 exceed the predetermined limit, the method passes to 510. At 510 the controller 110 determines whether the sum of all the capacitance levels detected at 502 is within a range. The sum may also be referred to at the Z coordinate. The range may have a lower or first threshold and a higher or second threshold. The first threshold is determined at a level that verifies that there is a significant enough increase in capacitance to qualify as a valid touch. The second threshold may be used to reject unwanted "touches", such as when the palm of the hand comes in contact with the touch sensor 10. Therefore, if the sum or Z coordinate is not within the range, the method returns to 502 and the baseline is not updated. If the sum or Z coordinate is within the range, a valid touch is detected and at 512 the controller 110 calculates a net measurement for each of the electronic channels 190-202, which is the difference between the most current measured value (detected at 502) and the baseline.

Next, at 514 the controller 110 determines or calculates the horizontal coordinate. For example, capacitance signals from electronic channels 190, 200 and 202, which correspond to horizontal detection electrodes 118, 174 and 182, respectively, would be used. In one embodiment, a weighted sum may be calculated over all of the electronic channels that detect signals from horizontal detection electrodes. By way of example only, the following formula may be used to calculate the weighted sum of the horizontal coordinate: $X=(\Sigma X_i * S_i)/(\Sigma S_i)$, wherein the electrode number "i" has X coordinate $X_i$ and touch signal $S_i$. In another embodiment, the controller 110 would determine which of the electronic channels 190, 200 and 202 has the largest capacitance value or signal. This measurement would be used in conjunction with the capacitance values from the two neighboring horizontal detection electrodes to calculate a horizontal position. For example, if electronic channel 200 (corresponding to horizontal detection electrode 174) has the greatest capacitance value and the capacitance values of the electronic channels 190 and 202 are substantially the same, the controller 110 may determine that the touch is centered on the horizontal detection electrode 174. If the capacitance value of the electronic channel 190 is less than the electronic channel 200 but greater than electronic channel 202, then the touch may be positioned between the horizontal detection electrodes 118 and 174 and closer to the horizontal detection electrode 174.

The controller 110 then determines the vertical coordinate location. The electrode pattern shown in FIG. 3 illustrates an embodiment wherein a single electronic channel is connected to the vertical detection electrode(s) in each column. As discussed further below, more than one electronic channel may be connected to different ones of the vertical detection electrodes in each column. At 516, the controller 110 can be configured to determine how many electronic channels are connected per column according to a specific embodiment (alternatively, for other embodiments, the controller 110 already knows how many electronic channels are connected per column). If there is one electronic channel per column, then the method proceeds at step 518, or if there are two electronic channels per column, then the method proceeds at step 530.

At 518 the controller 110 compares the net measurements of the electronic channels connected to the vertical detection electrodes to a threshold. At 520, if the net measurement is greater than the threshold, the controller 110 may assign a binary "1" to the channel. If the net measurement is less than the threshold, the controller 110 may assign a binary "0" to the channel. At 522, the controller 110 determines the vertical coordinate location based on a "binary code" assigned at 520.

For example, the "binary code" 236 is shown to the left side of the touch sensor 10 in FIG. 3 and will be discussed with respect to the first area 104. The electronic channel 190-198 corresponding to the column within the binary code 236 is indicated above the binary code 236. If a binary code of 10000 is generated, the left-most "1" indicates that a horizontal detection electrode has exceeded a threshold. In the example shown, the left-most "1" corresponds to the electronic channel 190 that detects signal from column 152 and electrode 118 of area 104. The binary codes and/or binary values associated with electronic channels 200 and 202 and thus horizontal detection electrodes 174 and 182, respectively, are not shown. The four zeros "0000" correspond to the four columns of vertical detection electrodes 120-148 that did not generate a signal above a threshold. In FIG. 3, the corresponding columns of vertical detection electrodes in each of the areas 104, 106 and 108 are tied together, and thus no vertical detection electrode on the touch sensor 10 generated a signal above a threshold. For example, if electronic channel 192 is assigned a binary value of "0", then the touch is located in the top half of the touch sensor 10. If electronic channel 194 is assigned a binary value of "0", then the touch is located in either the top quarter or lower-middle quarter of the touch sensor 10. The binary code assigned to electronic channel 196 identifies which set of vertical eighths of the touch sensor 10 the touch is located within, and the binary code assigned to electronic channel 198 identifies which set of vertical sixteenths of the touch sensor 10 the touch is located within. That is, channels 196 and 198 determine whether the touch is on the areas with electrodes or on the blank areas without the electrodes, and the vertical position can be determined by combining all vertical channel information.

In the example wherein the binary code is "10000", the "1" identifies the horizontal location on the touch sensor 10 and the vertical location is within the top sixteenth of the touch sensor 10. Therefore, returning to FIG. 4, at 524 the controller 110 determines the coordinate location of the touch based on the binary code 236.

A touch just slightly lower on the touch sensor 10 that covers at least a part of vertical detection electrode 134 may generate a binary code of 10001. Therefore, the binary code as determined by the controller 110 is indicated in FIG. 3 as parallel or in-line with the vertical position of a touch that would generate the binary code. It should be understood that, similar to top 228, bottom 230, left 232 and right 234, descriptions of top half, bottom half, top quarter, and the like that are used with respect to the touch sensor 10 are used for convenience when referring to the figures, and that the use and/or implementation of the touch sensor 10 with a system 100 is not so limited.

In the example of the electrode pattern of the first area 104, sixteen discrete binary codes may be generated based on the signal levels detected on the electronic channels 190-198. In other words, a touch may be determined to be in one of sixteen vertical detection zones. In general, the number of vertical detection zones in a given area may be based on the number of columns of vertical detection electrodes. For example, four adjacent columns of vertical detection electrodes facilitate detection of a touch within one of sixteen vertical detection zones. Stated generally, the number of vertical detection zones within which a touch may be detected equals $2^N$, where N equals the number of columns of adjacent vertical electrodes. The vertical electrodes in a given area are substantially parallel to the horizontal electrode in specific embodiments, but other embodiments may have such vertical electrodes be offset by an angular amount from the horizontal electrode and remain within the scope of the invention. It should be noted that a particular "vertical detection electrode" (for example, as labeled 6 in FIG. 5) may be made of more than one electrode or electrode portions (for example, as labeled 308 and 312 in FIG. 5) that are electrically connected.

Figure 5:
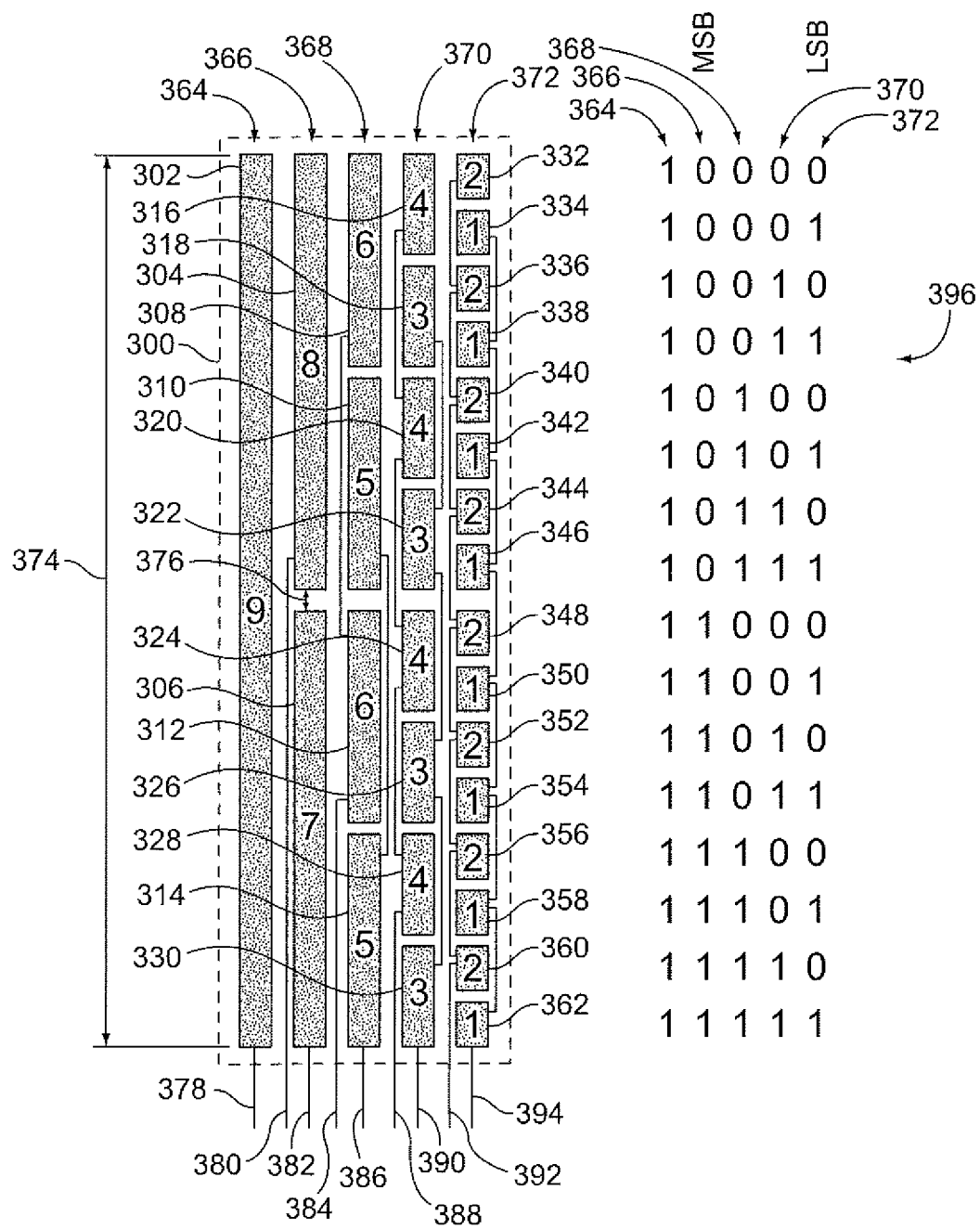
FIG. 5 illustrates an electrode pattern formed in accordance with an embodiment of the present invention.

As described in more detail below, in other embodiments, the number of vertical detection zones may based on a number of pairs of vertical detection electrodes. For example, FIG. 5 illustrates four pairs of vertical detection electrodes (a pair of vertical detection electrodes labeled 8,7; a pair of vertical detection electrodes labeled 6,5; a pair of vertical detection electrodes labeled 4,3; and a pair of vertical detection electrodes labeled 2,1). In this case, the four pairs of vertical detection electrodes yield sixteen vertical detection zones in an area. Stated generally, the number of vertical detection zones within which a touch may be detected equals $2^P$, where P equals the number of pairs of vertical detection electrodes that are in a given area.

Ratios and/or interpolation, as discussed further below, may be used to accomplish a finer vertical precision.

FIG. 5 illustrates an electrode pattern that has a larger number of electrodes within area 300 compared to the electrode pattern of FIG. 3, according to a specific embodiment. Although only one area 300 is shown, a touch sensor may have many similar areas with the electrode pattern repeated across the touch sensor. As discussed with respect to FIGS. 3 and 4, signals from horizontal detection electrodes are used to identify the horizontal location of a touch on the touch sensor and signals from vertical detection electrodes are used to identify the vertical location of the touch on the touch sensor. Binary code 396 is also shown. In this embodiment, there are two electronic channels per column for the vertical detection electrodes.

Horizontal detection electrode 302 extends along a height 374 of column 364. Vertical detection electrodes 304 and 306 are substantially equally-sized and extend partially along the height 374 of column 366 and are physically separate with respect to each other. Gap 376 separates the vertical detection electrodes 304 and 306. Vertical detection electrodes 308-314 are substantially equally-sized and extend partially along the height 374 of column 368 and are physically separate with respect to each other, separated by gaps (not indicated with item numbers). Vertical detection electrodes 316-330 are substantially equally-sized and extend partially along the height 374 of column 370 and are physically separate with respect to each other, and vertical detection electrodes 332-362 are substantially equally-sized and extend partially along the height 374 of column 372 and are physically separate with respect to each other. It should be understood that in other embodiments more or less than four columns 366-372 may be included in each area, and that different areas may have different numbers of columns of vertical detection electrodes.

The horizontal detection electrode 302 is electrically connected to electronic channel 378 of the controller 110 (as shown in FIG. 3). The vertical detection electrodes 304 and 306 are connected to electronic channels 380 and 382, respectively. Vertical detection electrodes 308 and 312 are connected to electronic channel 384, while vertical detection electrodes 310 and 314 are connected to electronic channel 386. Vertical detection electrodes 316, 320, 324, and 328 are connected to electronic channel 388. Vertical detection electrodes 318, 322, 326 and 330 are connected to electronic channel 390. Vertical detection electrodes 332, 336, 340, 344, 348, 352, 356 and 360 are connected to electronic channel 392. Vertical detection electrodes 334, 338, 342, 346, 350, 354, 358 and 362 are connected to electronic channel 394. Therefore, the connections to the two electronic channels within a column alternate between adjacent vertical detection electrodes.

As discussed with respect to FIG. 3, the horizontal detection electrode 302 may be the only electrode connected to the electronic channel 378. Other horizontal detection electrodes on the touch sensor may each be connected to their own electronic channels. The vertical detection electrodes 304-362 may be electrically connected to corresponding electrodes within other areas (not shown) to minimize the number of electronic channels needed. In the example of FIG. 5, nine electronic channels 378-394 are shown, and each additional area would result in an additional electronic channel that is connected to the horizontal detection electrode.

Returning to FIG. 4, at 516 the controller 110 would be configured to determine or otherwise know for the embodiment shown in FIG. 5 that the vertical detection electrodes in at least one of the columns 366-372 are connected to two electronic channels, and the method proceeds from 516 to 530. In one embodiment, if the vertical detection electrodes in one or more of the columns 366-372 were connected to a single electronic channel, such as discussed with respect to FIG. 3, then 518-524 may be used for the applicable channels.

At 530 the controller 110 compares the net measurements of the two channels that detect signals from vertical detection electrodes located within the same column to each other. For the vertical detection electrodes, the most significant bit (MSB) is determined by the measurement of vertical detection electrodes 304 and 306, and the least significant bit (LSB) is determined by the measurements of the vertical detection electrodes 332, 334, 336, 338, 340, 342, 344, 346, 348, 350, 352, 354, 356, 358, 360 and 362. The binary code 396 determined by the vertical detection electrodes (in this example, the four digit code from MSB to LSB) at 532 is used by controller 110 at 534 to determine where the touch is located vertically on the touch sensor; whereas the horizontal detection electrodes are used to determine where the touch is located horizontally on the touch sensor (e.g., horizontal detection electrode 302 is assigned a binary value of "1" at step 514 if a signal is detected indicating a touch for the associated horizontal coordinate).

Therefore, if a touch is located in the top half of the touch sensor, the net measurement of the electronic channel 380 is greater than the net measurement of the electronic channel 382. If the touch is located in the bottom half of the touch sensor, the net measurement of the electronic channel 382 is greater than the net measurement of the electronic channel 380. When the net measurement of the electronic channel 380 is greater, indicating a touch located in the top half of the touch sensor, the binary value in the column 366 of the binary code 396 associated with electronic channels 380 and 382 is assigned a "0", and if the touch is located in the bottom half of the touch sensor, wherein the net measurement of the electronic channel 382 is greater, the binary value is a "1".

Similarly, if the electronic channel 384, which is connected to both the uppermost vertical detection electrode 308 and the middle-lower vertical detection electrode 312 in column 368, detects the touch (and thus has a greater net measurement than electronic channel 386), then the binary value in column 368 within the binary code 396 is assigned a "0". If the electronic channel 386 connected to both the middle-upper vertical detection electrode 310 and the lowermost vertical detection electrode 314 detects the touch (e.g., net measurement of the electronic channel 386 is greater than net measurement of electronic channel 384), then the binary value in column 368 is assigned a "1".

The next column (column 370) to the right in the binary code 396 is determined by the net measurements on the two electronic channels 388 and 390, which determine which set of vertical eighths of the touch sensor the touch is located within. In the example shown, a binary value of "0" is assigned to column 370 if the binary code 396 when the electronic channel 388 has the highest net measurement, and a binary value of "1" is assigned when the electronic channel 390 has the highest net measurement.

The right-most column 372 in the binary code 396, which is the LSB, is determined by the net measurements on the two electronic channels 392 and 394 which determine which set of vertical sixteenths of the touch sensor the touch is located within. In this example, a binary value of "0" is assigned when the electronic channel 392 has the highest net measurement, and a binary value of "1" is assigned when the electronic channel 394 has the highest net measurement.

Returning to FIG. 4, at 534 the controller 110 determines the vertical coordinate location of the touch based on the binary code. At 536 the controller 110 determines the coordinate location of the touch based on the previously determined horizontal and vertical coordinate locations. Accordingly, a discrete location of the touch may be quickly identified based on the binary code 396. It should be understood that the horizontal and vertical coordinate locations may be determined in any order or may be determined concurrently.

Further comparisons, ratios and/or interpolation may be used to further refine the vertical coordinate location. For example, finer resolution may be achieved beyond the sixteen discrete vertical positions by calculating a ratio between electronic channel net measurements (as discussed further below) in addition to performing the comparisons as discussed above. For example, ratios of the signals from the vertical detection electrodes can be used to interpolate a more precise vertical position between two discrete vertical positions.

In addition, the size of the touch may be determined. A minimum size may be predetermined, such as five mm, wherein a touch that is determined to be less than five mm in size is rejected. This may be determined, for example, by requiring five columns of electrodes that are adjacent to each other on the touch sensor to generate capacitance levels indicative of a touch. Other minimum and/or maximum sizes may be used. When a ratio is determined to fine tune the resolution, the size of the touch may be taken into consideration. For example, a ratio correction curve may be selected based on the size of the touch. A plurality of ratio correction curves may be used.

Additionally, any number of filters, processing, offset correction, and the like may be applied. For example, a touch may only be validated if the touch is reported for a minimum of three consecutive scans.

In other embodiments, smaller electrodes and/or more columns of electrodes may be included within the area 300 to provide increased precision. Furthermore, the vertical resolution may be doubled or otherwise increased by adding only one or several channels.

FIG. 6(*a*) illustrates an electrode pattern that utilizes the same number of electronic channels as the electrode pattern in FIG. 5, according to another specific embodiment. However, the dimensions, positions and quantity of the electrodes are different. Although only one area 400 is shown, a touch sensor may have many areas with the illustrated pattern repeated across the touch sensor. Again, signals from horizontal detection electrode 402 and other horizontal detection electrodes (not shown) may be used to identify the horizontal location of a touch on the touch sensor. Signals from vertical detection electrodes 404-440 and other vertical detection electrodes (not shown) may be used to identify the vertical location of the touch on the touch sensor.

The horizontal detection electrode 402 extends along a height 460 of column 462. Vertical detection electrodes 404 and 406 extend partially along the height 460 of column 464 and are physically separate with respect to each other. Gap 472 separates the vertical detection electrodes 404 and 406. Vertical detection electrodes 408-412 extend partially along the height 460 of column 466 and are physically separate with respect to each other, separated by gaps 474 and 476. Vertical detection electrodes 414-422 extend partially along the height 460 of column 468 and are physically separate with respect to each other, separated by gaps (not indicated by item numbers). Vertical detection electrodes 424-440 extend partially along the height 460 of column 470 and are physically separate with respect to each other, also separated by gaps. As discussed previously, the columns 462-470 may be arranged in any order within the area 400.

The gaps 472, 474 and 476, as well as the other gaps not indicated with item numbers, are located distances from top 478 of the area 400 that are different with respect to each other. As seen in FIG. 6(*a*), there are fifteen gaps vertically separating the various vertical detection electrodes from each other, and these gaps are different distances from the top 478. For example, gaps 472, 474 and 476 are located distances D1, D2 and D3, respectively, from the top 478. With respect to the gap 472, vertical detection electrodes 410, 418 and 432 in the other columns 466, 468 and 470, respectively, extend through the distance D1. By offsetting the gaps 472-476, as well as the other gaps within the electrode pattern, the binary code of one discrete vertical position and that of either neighboring vertical positions differs by only one bit. Since only one bit changes state from one position to the next, certain data errors that could occur during state changes are prevented, and thus the data is more reliable. For example, in FIG. 5, if the touch is located slightly above the middle of the area 300 and moves downward slightly, the binary code will change from 10111 to 11000. In this case, all four vertical bits must change simultaneously in order to avoid the reporting of an erroneous vertical location. In FIG. 6(*a*), however, only one electronic channel will change state, or binary value, at a time as a finger is moved downward through the area 400.

As with the electrode pattern of FIG. 5, the horizontal detection electrode 402 may be electrically connected to electronic channel 442 of the controller 110 (as shown in FIG. 3). The vertical detection electrodes 404 and 406 are connected to electronic channels 444 and 446, respectively. Vertical detection electrodes 408 and 412 are connected to electronic channel 448, while vertical detection electrode 410 is connected to electronic channel 450. Therefore, each column may not have an equal number of electrodes connected to each of the channels. Vertical detection electrodes 414, 418 and 422 are connected to electronic channel 452, alternating with the vertical detection electrodes 416 and 420 that are connected to electronic channel 454. Vertical detection electrodes 424, 428, 432, 436 and 440 are connected to electronic channel 456, alternating with the vertical detection electrodes 426, 430, 434 and 438 that are connected to electronic channel 458.

Again, the horizontal detection electrode 402 may be the only electrode connected to the electronic channel 442. The vertical detection electrodes 404-440 may be electrically connected to corresponding electrodes within other areas (not shown) to minimize the number of electronic channels needed.

An exemplary binary code 480 is illustrated next to the area 400. If electronic channel 444, associated with vertical detection electrode 404, has a greater signal than electronic channel 446, which is associated with the vertical detection electrode 406, then the touch is in the upper half of the area 400 and a binary value of "0" may be assigned to the corresponding column of the binary code 480. If the electronic channel 446 has a greater signal than electronic channel 444, then the touch is in the lower half of the area 400 and a binary value of "1" may be assigned. The discrete vertical location of the touch may be quickly identified based on the binary code 480, ratios and/or comparisons between the adjacent electrodes in a same column (such as adjacent electrodes 404 and 406 in column 464), comparisons between electrodes of adjacent columns, interpolation and/or further processing. In other embodiments, smaller electrodes, additional electronic channels, and/or more columns of electrodes may be included within the area 400 to provide increased precision.

For example, finer resolution may be achieved beyond the sixteen discrete vertical positions as indicated by the binary code 480 by calculating ratios between certain channel net measurements in addition to performing the comparisons as discussed with respect to FIG. 4. For example, referring to the electrode pattern of FIG. 6(a), a ratio between two signals within one column may be used together with a ratio between two signals within another column.

Figure 6A:
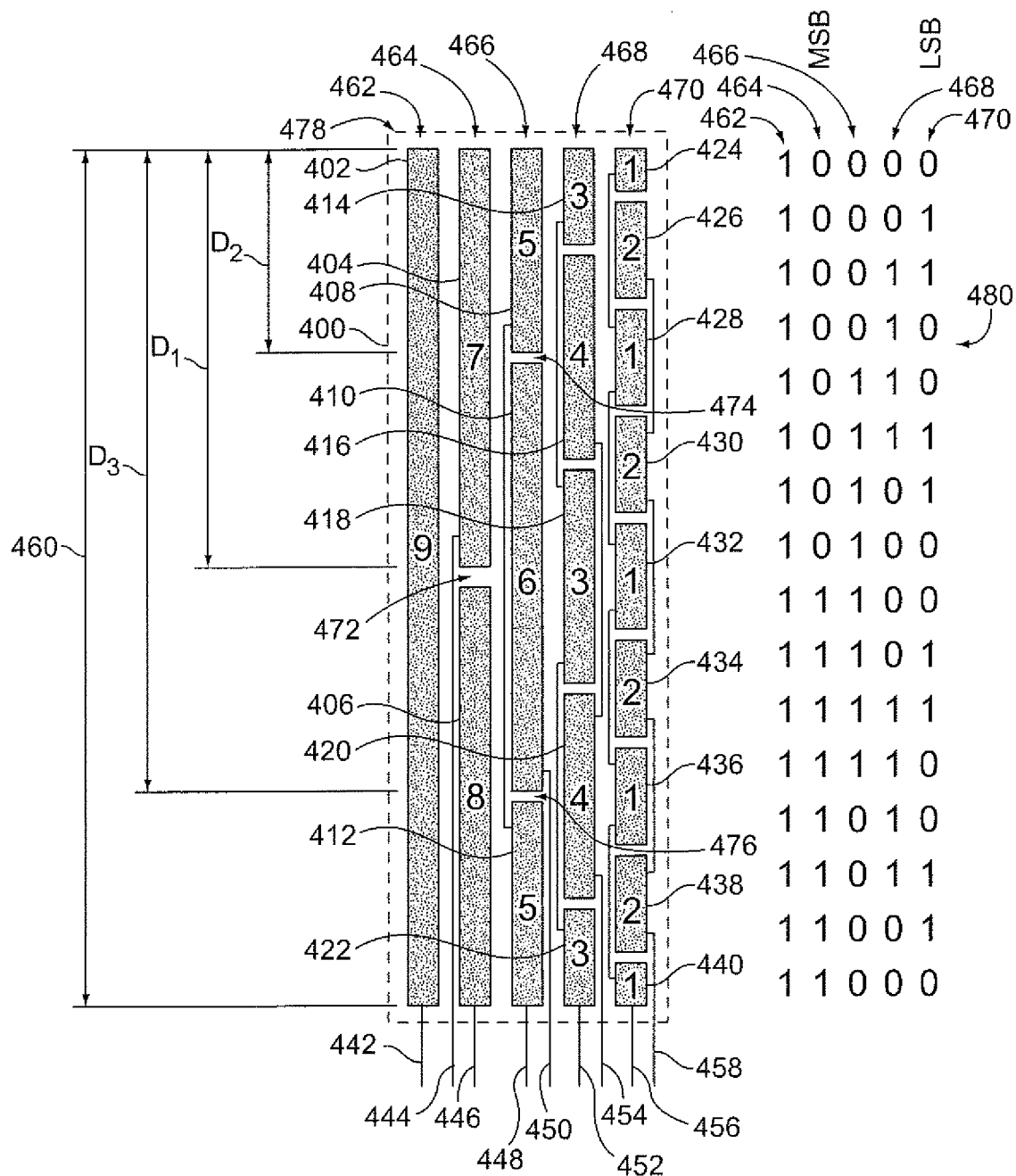
FIG. 6(a) illustrates an electrode pattern having offset electrodes that are formed in accordance with an embodiment of the present invention.
Figure 6B:
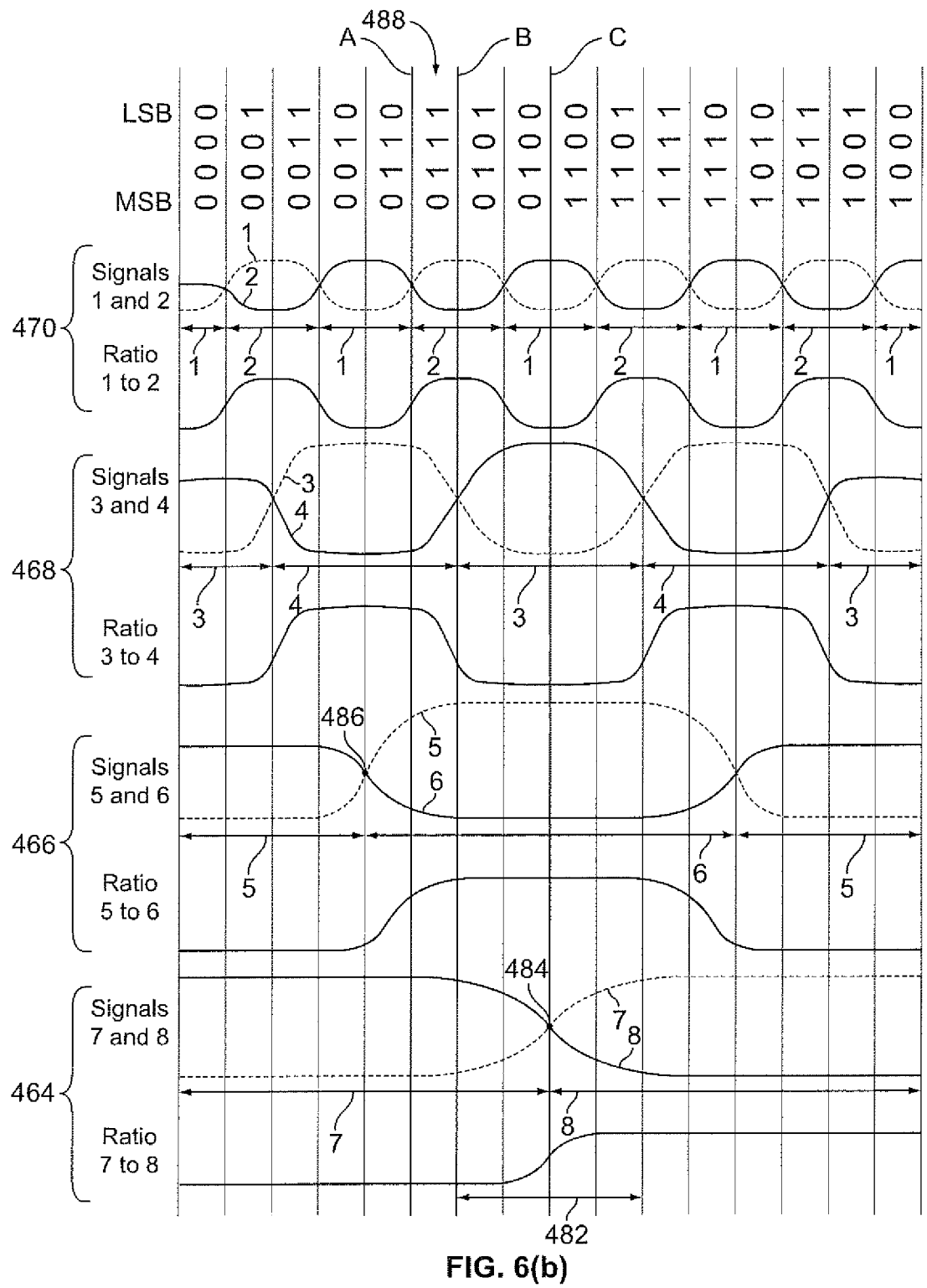
FIG. 6(b) illustrates signals on all vertical electrodes of an area as a function of a vertical coordinate of a touch determined in accordance with an embodiment of the present invention.

FIG. 6(b) illustrates signals of all eight vertical detection electrodes as well as ratios between the two signals in each of the four columns (464, 466, 468 and 470) as a function of a touch moving along the Y axis, such as from the top 478 of the area 400 to the bottom, according to a specific embodiment. The numbers 1-8 are used to indicate the signals associated with the vertical detection electrodes 404-440, which are also indicated with numbers 1-8, of FIG. 6(a). The columns 464, 466, 468 and 470, as previously discussed with respect to FIG. 6(a), are illustrated on the left side of the figure. The binary code for each of the vertical positions is shown at the top of the figure. It should be noted that the horizontal bit of the binary code is excluded, and that arrow 482 indicates the vertical direction. Lines indicating vertical locations "A", "B" and "C" are also shown.

The two signals that are shown for each column 464-470 reflect that an active touch is present at each vertical location corresponding to each binary code. That is, the signals have amplitudes, or peaks and troughs. The signals reflecting active touches across one area of the touch sensor and along an entire height 460 of the area are displayed for ease of description herein, but do not reflect an application of the touch sensor. For example, the signal amplitudes of signals 1-8 as shown may be captured to reflect a finger touch being dragged from the top 478 of the area 400 to the bottom. When a touch is not present at a particular vertical/horizontal location, the amplitude of the signals would be at zero or other constant or minimally varying value.

Ratios between signals within columns can be used to interpolate a more precise vertical position within the range of the discrete vertical position. The crossing points of the signals correspond to the gaps between the electrodes in the columns. For example, crossing point 484 of the signals 7 and 8 corresponds to the gap 472, and crossing point 486 between signals 5 and 6 corresponds to the gap 474. For example, the initially determined discrete vertical position 488, which corresponds to binary code 0111, may be further refined to a vertical position within the range of the discrete vertical position, or between vertical locations "A" and "B". In other words, signal ratios that are used for interpolation are determined from the signals in the two columns that contain a gap between electrodes on either vertical side of the determined discrete vertical position. In this example, column 470 contains a gap between electrodes 1 and 2 at the top of the discrete vertical position 488, where the gap corresponds to the crossing of signals 1 and 2 at vertical location "A" Likewise, column 468 contains a gap between electrodes 3 and 4 at the bottom of discrete vertical position 488, where the gap corresponds to the crossing of signals 3 and 4 at vertical location "B". At vertical location "A", the slopes of the signals 1 and 2 of column 470 are relatively steep and therefore the ratio curve of signals 1 and 2 is also steep near this vertical location. In this example, signals 1 and 2 may be reviewed first as the electrodes in column 470, in the embodiment shown, are the smallest in size. The ratio between signals 1 and 2 at vertical location "A" may be changing enough to provide sufficient information for determining a more precise vertical position. Near vertical location "B", however, the slopes of the signals 1 and 2 are relatively flat and therefore the ratio curve of signals 1 and 2 is also flat around this vertical location. The ratio of signals 1 and 2 is not changing enough around vertical location "B" to accurately determine a more precise vertical position based solely on this ratio. The ratio between signals 3 and 4 of column 468 is changing relatively significantly at vertical location "B", however, and thus this ratio may be used in combination with the ratio of signals 1 and 2 to interpolate a more precise vertical position. For example, the two ratios may be divided to determine a magnitude that is used to calculate an interpolated vertical position between the initially determined discrete vertical location (such as may be determined using the method of FIG. 4) and the neighboring positions. For example, the initially calculated discrete vertical position 488, corresponding to binary code 0111, may be adjusted vertically based on the magnitude corresponding to the two ratios, namely, between the ratio of signals 1 and 2 and between the ratio of signals 3 and 4.

At vertical location "C", or the vertical centerline which is in between the discrete vertical positions associated with binary codes 0100 and 1100, the slopes of the signals 1, 2, 3 and 4 of columns 468 and 470 and thus the associated ratio curves are all relatively flat. Therefore there is not enough information between these two columns alone to precisely determine the vertical location near vertical location "C". The ratio between signals 7 and 8 of column 464 is, however, changing significantly at vertical location "C" and so this ratio can be used in combination with the ratio between signals 1 and 2 to calculate a more exact vertical location. In one embodiment, it may be desirable to use the ratio of the signals 1 and 2, either alone or in combination with another ratio. It should be understood that the second set of signals may be within a different area. In some embodiments, the sets of signals to use for interpolation may be predetermined based on the binary code.

Although not shown, a touch may extend across more than one area. In some embodiments, signals 1 and 2, or other sets of signals, from more than one area may be used to interpolate a touch location.

It should be understood that the use of interpolation may depend upon the desired resolution. For example, interpolation may not be used if the size of the smallest electrodes within the column associated with the LSB provides the desired vertical resolution.

Figure 7:
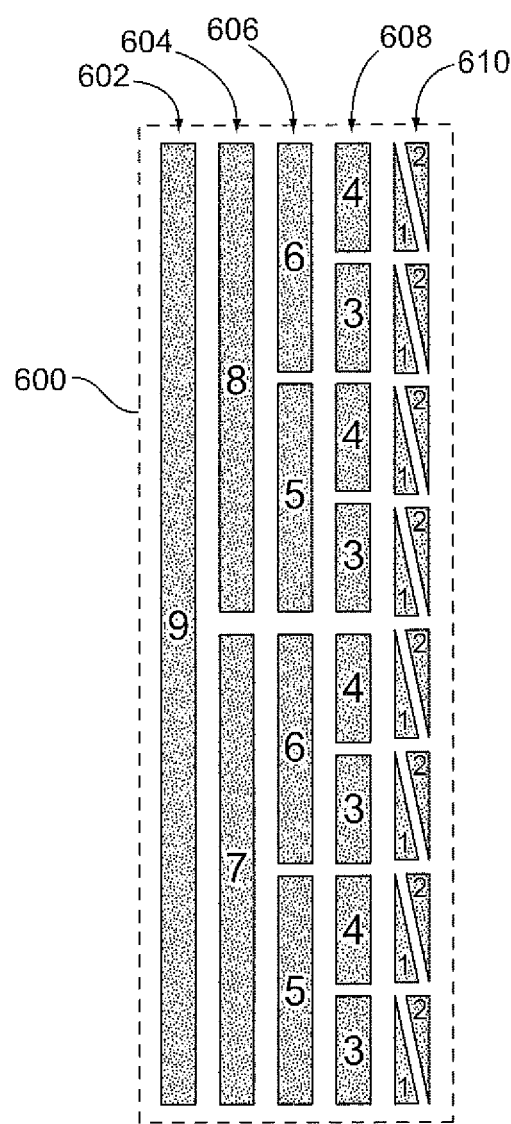
FIG. 7 illustrates another electrode pattern formed in accordance with an embodiment of the present invention.

FIG. 7 illustrates another electrode pattern, according to another specific embodiment. Area 600 includes columns 602, 604, 606, 608 and 610. The electrodes in columns 602-608 are the same configuration as illustrated in FIG. 5, and thus will not be described again. Vertical detection electrodes in column 610, however, are triangular shaped, wherein vertical detection electrodes indicated with a "1" are all connected to one electronic channel and vertical detection electrodes indicated with a "2" are all connected to another electronic channel. The vertical detection electrodes in columns 604-608 determine in which vertical eighth the touch is located. The ratio between measurements of a pair of triangular electrodes "1" and "2" in column 610 may be used to interpolate a more precise position within the discrete vertical eighth associated with that pair. That is, if the touch is vertically located so that the signal in column 608 is essentially all in one electrode (e.g., an electrode 3), then the ratio of the signals in column 610 in electrodes 1 and 2 gives a fine measurement of the vertical position of the touch within the length of the touched electrode 3 in column 608. In contrast, when the signal in column 608 is shared between two electrodes (one labeled "3" and another labeled "4"), then this ratio of the signals in column 610 is used to provide a fine measurement of the vertical position of the touch or the signals from column 610 may not be used. Accordingly, in other embodiments similar to FIG. 7, the binary electrode pattern according to various specific embodiments may be utilized with another electrode pattern (such as seen in column 610).

Figure 8:
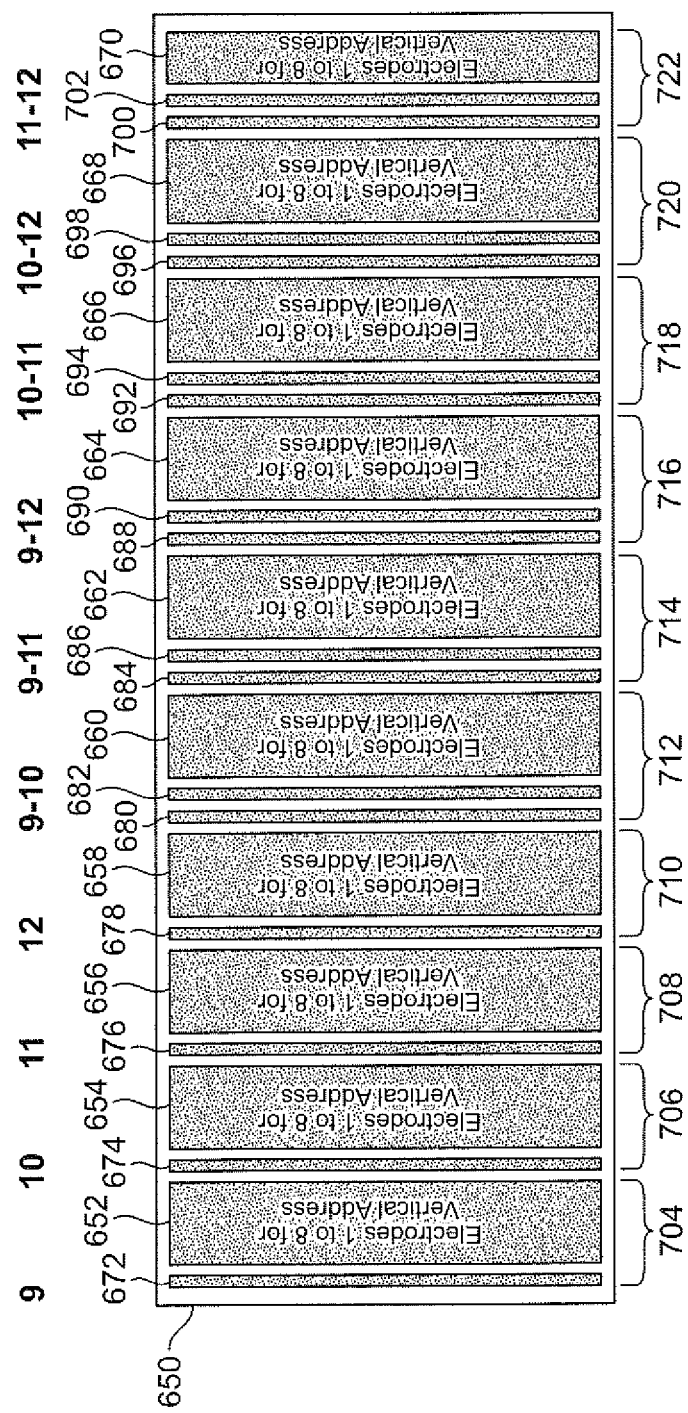
FIG. 8 illustrates a touch sensor wherein more than one horizontal detection electrode may be connected to the same electronic channel in accordance with an embodiment of the present invention.

FIG. 8 illustrates a touch sensor 650 wherein more than one horizontal detection electrode may be connected to the same electronic channel, according to a specific embodiment. As discussed above with respect to FIGS. 2(a) and 2(b), rectangular blocks 652, 654, 656, 658, 660, 662, 664, 666, 668 and 670 generally indicate the vertical detection electrodes that may be arranged in one or more of the electrode patterns previously discussed, or a different electrode pattern. The vertical detection electrodes in one block 652 may be connected to the corresponding vertical detection electrodes in the other blocks 654-670 as previously discussed.

Possible electronic channel assignments are shown above the associated horizontal detection electrodes of the touch sensor 650. In one embodiment, horizontal detection electrodes 672, 674, 676 and 678 are assigned to electronic channels nine, ten, eleven and twelve, respectively. Therefore, the sets of electrodes within areas 704, 706, 708 and 710 each include one horizontal detection electrode and a plurality of vertical detection electrodes.

The size of the touch sensor 650 may be increased without increasing the number of electronic channels needed (or minimizing the number of additional electronic channels needed) by increasing the number of areas in the horizontal direction and by sensing more than one horizontal detection electrode with the same electronic channel. The sets of electrodes within areas 712-722 each include two horizontal detection electrodes and a plurality of vertical detection electrodes. For example, horizontal detection electrodes 680 and 682 within the area 712 are sensed by electronic channels nine and ten, respectively. Horizontal detection electrodes 684 and 686 within the area 714 are sensed by electronic channels nine and eleven, respectively. Area 716 has two horizontal detection electrodes 688 and 690 sensed by electronic channels nine and twelve, respectively, area 718 has horizontal detection electrodes 692 and 694 sensed by electronic channels ten and eleven, respectively, area 720 has horizontal detection electrodes 696 and 698 sensed by electronic channels ten and twelve, respectively, and area 722 has horizontal detection electrodes 700 and 702 sensed by electronic channels eleven and twelve, respectively. Although areas are shown with one or two horizontal detection electrodes, one or more areas may have more than two horizontal detection electrodes.

The two horizontal detection electrodes within the areas 712-722 are illustrated as adjacent with respect to each other. That is, horizontal detection electrodes 680 and 682 are adjacent, horizontal detection electrodes 684 and 686 are adjacent, and so on. In other embodiments, the two horizontal detection electrodes within an area do not have to be adjacent to each other. For example, one of the horizontal detection electrodes may be interspersed with the columns of vertical detection electrodes, or may be positioned one on either side of the group of columns of vertical detection electrodes.

Additionally, it should be understood that different electronic channel assignments may be used other than those indicated in FIG. 8.

Figure 9:
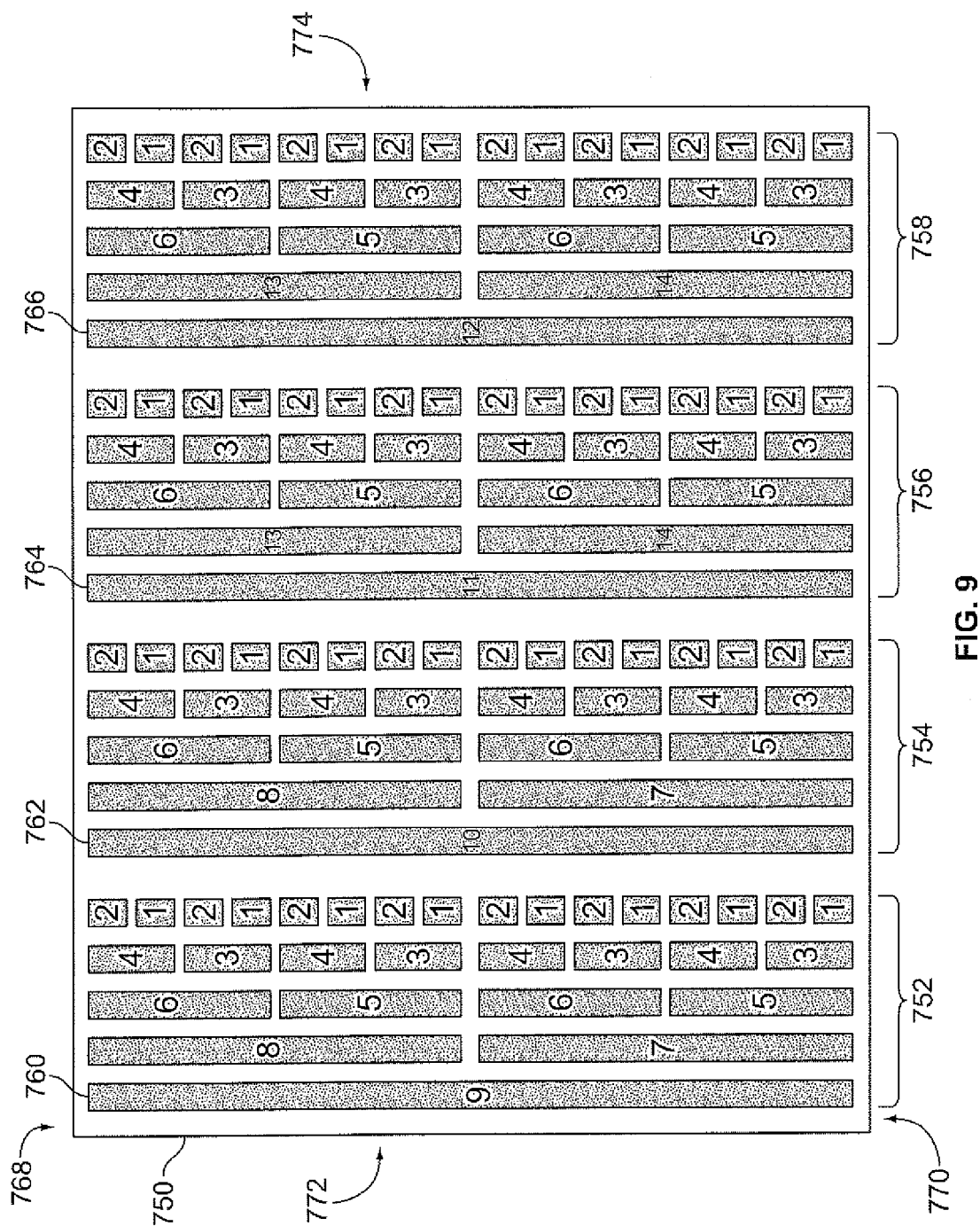
FIG. 9 illustrates a touch sensor formed in accordance with an embodiment of the present invention that may detect two simultaneous touches.

FIG. 9 illustrates a touch sensor 750 that may detect two simultaneous touches, according to a specific embodiment. The electrode pattern is similar to that discussed in FIG. 5. Four areas 752, 754, 756 and 758 each include one horizontal detection electrode 760, 762, 764 and 766, respectively. In one embodiment, the horizontal detection electrodes 760, 762, 764 and 766 are connected to different electronic channels nine, ten, eleven and twelve, respectively. The touch sensor 750 is discussed with respect to the designations of top 768, bottom 770, left 772 and right 774, but is not so limited.

The vertical detection electrodes in the different areas 752, 754, 756 and 758 are connected to the same electronic channels as indicated. For example, the vertical detection electrodes indicated with a "6" are all connected to the same channel. Vertical detection electrodes in the top half of the left side of the touch sensor 750 are connected to electronic channel "8" and two vertical detection electrodes in the bottom half of the left side of the touch sensor 750 are connected to the electronic channel "7". However, two corresponding vertical detection electrodes in areas 756 and 758, in the top half of the right side of the touch sensor 750, are connected to electronic channel "13" and not to electronic channel "8". Similarly, two corresponding vertical detection electrodes in areas 756 and 758, in the bottom half of the right side of the touch sensor 750, are connected to electronic channel "14" and not to electronic channel "7". Therefore, one touch may be detected on the left half of the touch sensor simultaneously with a second touch on the right half of the touch sensor. The horizontal coordinates of the touch on the right half of the touch sensor can be calculated by comparing signal levels associated with horizontal detection electrodes connected to electronic channels "11" and "12". Similarly, the horizontal coordinate of the simultaneous touch on the left half of the touch sensor may be calculated by comparing signal levels associated with horizontal detection electrodes connected to electronic channels "9" and "10". In this particular example, the vertical location of each touch can only be resolved to the upper or lower half of the touch sensor. The vertical detection electrodes connected to electronic channels "13" and "14" are the only vertical electrodes on the right half of the touch sensor that are electrically disconnected from those on the left half of the touch sensor. Therefore, electronic channels "13" and "14" are the only vertical electrodes used to calculate the vertical position of the touch on the right half of the touch sensor. Similarly, electronic channels "7" and "8" are the only vertical electrodes used to calculate the vertical position of the touch on the left half of the touch sensor.

Although not shown, other vertical electrodes may be connected to different electronic channels to provide further vertical resolution of two simultaneous touches in other areas or for detecting more than two simultaneous touches. For example, in order to maximally resolve the vertical coordinate associated with two touches in separate areas 752-758, the vertical detection electrodes in each area of the touch sensor may be electrically disconnected from those in other areas. In other words, vertical detection electrodes within columns of an area may only share electronic channels within the same area, according to some embodiments.

Figure 10:
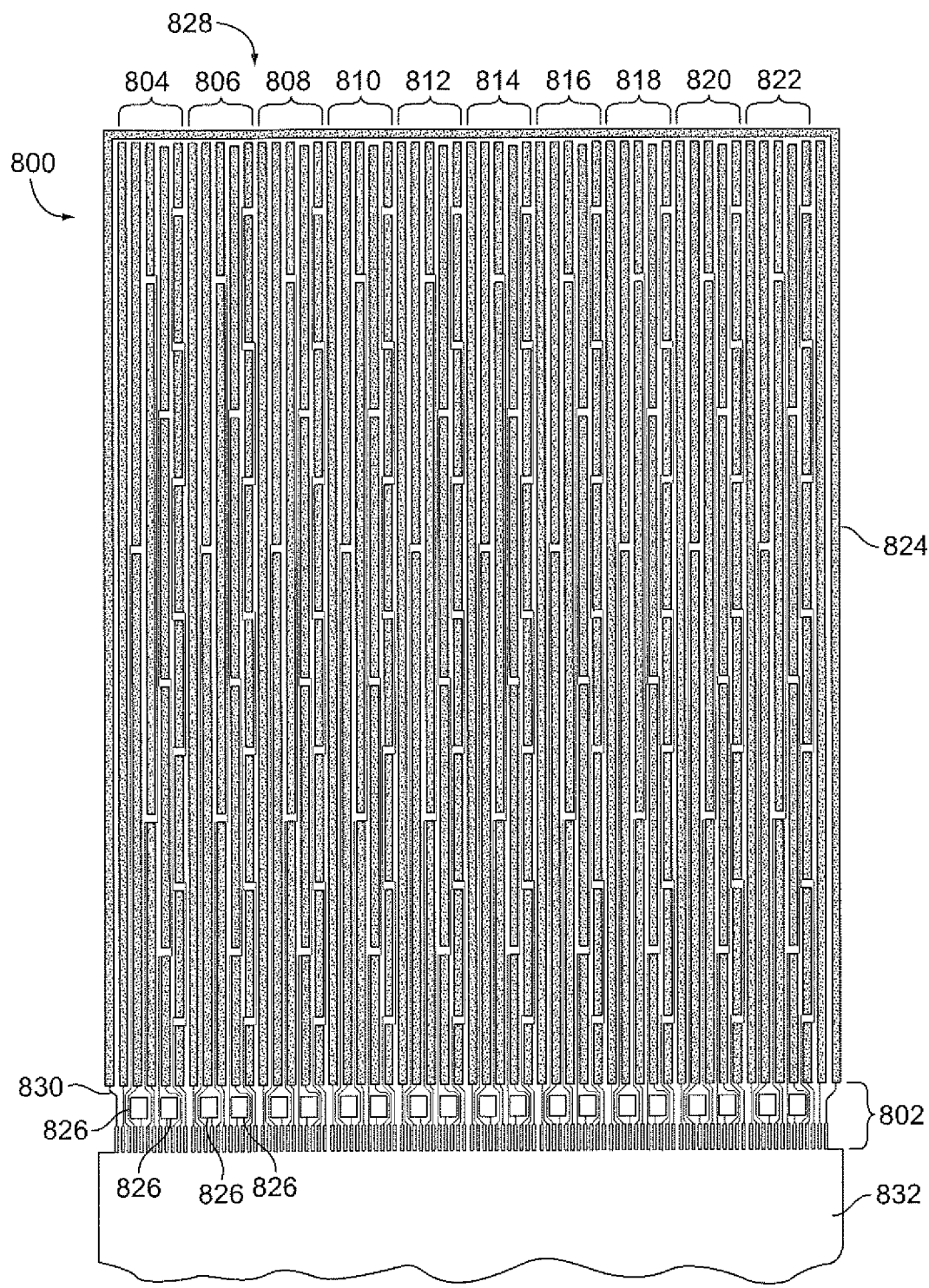
FIG. 10 illustrates a touch sensor that is connected to a flexible cable formed in accordance with an embodiment of the present invention.

FIG. 10 illustrates a touch sensor 800 that is connected at an interconnect area 802 to a flexible cable 832, according to another specific embodiment. The touch sensor 800 has areas 804, 806, 808, 810, 812, 814, 816, 818, 820 and 822 that have electrode patterns similar to the electrode pattern discussed in FIG. 6(a) wherein the gaps between electrodes are located at different distances from a top 828 of the touch sensor 800. A shield or guard electrode 824 extends around a perimeter of the touch sensor 800, but may be located on an opposite side of the substrate with respect to the electrodes as previously discussed.

The interconnect area 802 includes a plurality of interconnect touch veto electrodes 826 that are located proximate to a bottom edge 830 of the touch sensor 800. (Not all of the interconnect touch veto electrodes are indicated with item numbers.) If a touch is detected by any of the interconnect touch veto electrodes 826, then a touch may be rejected. For example, without the interconnect touch veto electrodes 826, a touch on the interconnect area 802 near the touch sensor 800 may cause an erroneous touch to be detected based on the increase in capacitance detected by some electronic channels. The interconnect touch veto electrodes 826 may be connected to the same electronic channel, or some of the interconnect touch veto electrodes 826 may be connected to a different electronic channel.

The flexible cable 832 may be two or more layers to accommodate the interconnections needed between the electrodes and the channels. Additionally, vias (not shown) may be used.

In other embodiments, hovering and/or force may be determined. For example, the controller 110 may calculate a z value, which may correspond to the area of the touch or the distance the finger is above (or away from) the touch surface 20. For example, as a finger nears the touch surface 20, the signals (such as signals 1-8) that correspond to the touch increase in magnitude. The calculated z value can be used to determine whether the finger is hovering over the sensor or making physical contact with the sensor. The touch coordinate is calculated the same way as discussed previously herein. The z value can be calculated by summing signals over only horizontal detection electrodes or a combination of horizontal and vertical detection electrodes. For example, a z value may be the sum of the signals of three horizontal detection electrodes (the horizontal detection electrode with the maximum signal of all horizontal electrodes and the two neighboring horizontal electrodes).

The force applied to the sensor during a touch can be determined by calculating a z value that is a function of this force, according to another specific embodiment. When a force is applied to the sensor, the substrate deforms and the electrodes are moved closer to the underlying ground plane, effectively increasing the magnitude of signals on all electrodes and not just those near the touch location. This z value may be the sum of all signals of horizontal electrodes.

A combination of hovering and force detection can be used to respectively excite and select icons on a display, according to another embodiment. For example, if the finger is hovering a distance, such as a half of an inch or less above the touch surface 20, such as over an icon or letter on a keyboard, the letter may be highlighted. When the controller 110 determines that a predetermined amount of force has been applied to the touch surface 20 corresponding to the same touch area, the icon or letter may be selected or activated.

The single layer electrode patterns described above may be utilized as touch sensors to measure self-capacitance according to the embodiments described above and/or to measure mutual-capacitance according to further embodiments described below.

Figure 11:
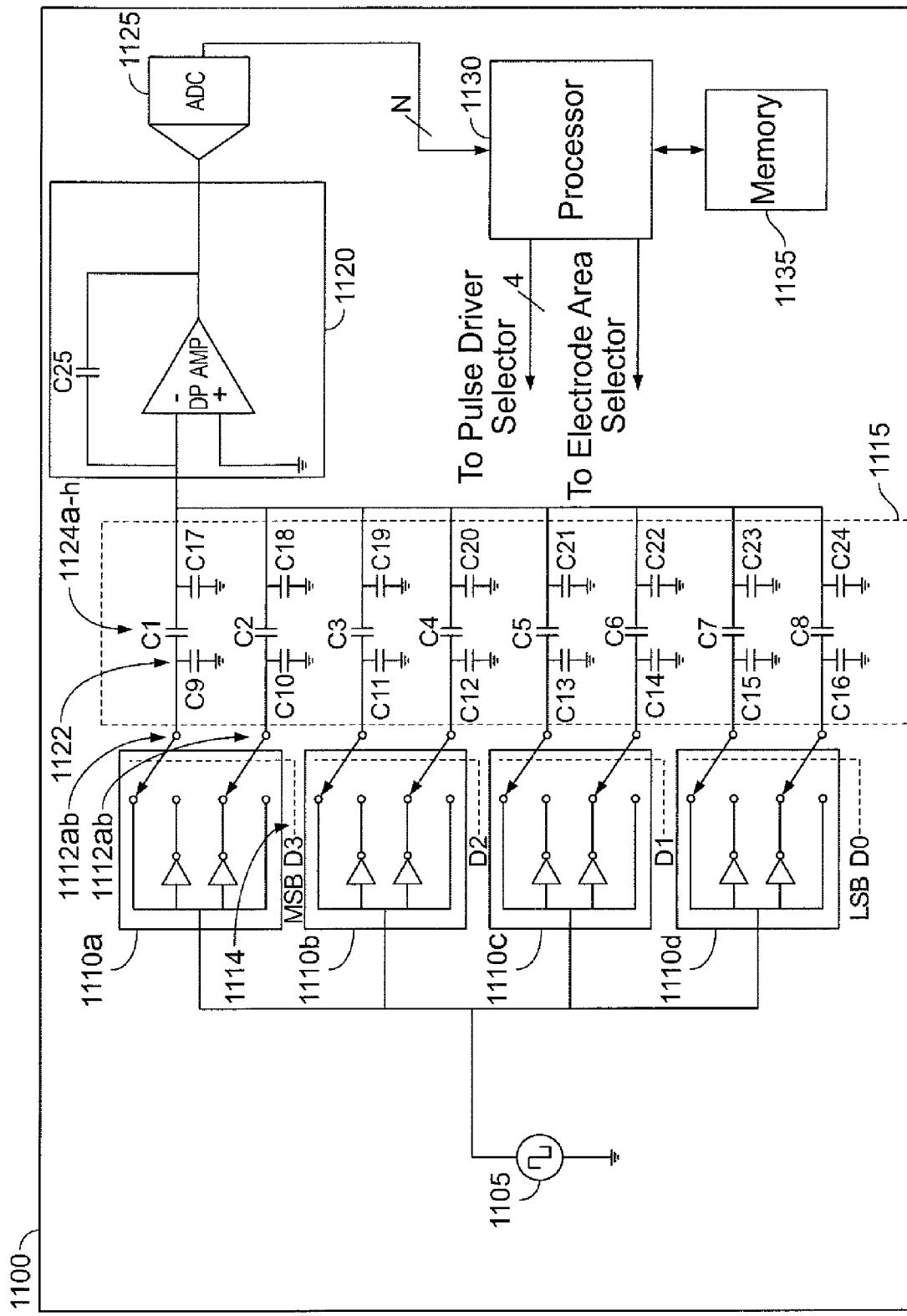
FIG. 11 is a conceptual circuit diagram of an exemplary circuit coupled to a given detection electrode area that may be utilized in connection with one or more of the electrode patterns described herein to determine a touch location, according to specific embodiments.

FIG. 11 is a conceptual circuit diagram 1100 of an exemplary circuit coupled to a given detection electrode area that may be utilized in connection with one or more of the electrode patterns described above to determine a touch location, according to specific embodiments. As described in more detail below, mutual capacitance between pairs of electrodes is measured by driving one electrode of the pair with an oscillating signal and sensing a resulting signal on the other member of the pair via a sense circuit, such as an integrator circuit. The output of the sense circuit is a measure of the mutual capacitance between the electrodes. A touch in the vicinity of the electrodes causes a reduction of mutual capacitance between the electrodes, as the finger reduces the number of electric field lines connecting the drive and sense electrodes.

While certain embodiments are disclosed other variations exist. For example, not all driving electrodes are necessarily driven at the same time and so in some embodiments, non-driven electrodes may be either grounded or left floating. Moreover, the driving and sensing of the electrodes may be reversed. That is, the sensed electrode may instead be driven, and the driven electrode may be sensed. For example, in the exemplary circuit diagram 1100, the vertical electrodes in a given area are being driven and the horizontal electrode for that area is used to measure the mutual capacitance changes resulting from touches. In a particular vertical electrode column, the vertical electrodes of one channel are driven with a pulse having a first phase and the other vertical electrodes of the second channel are driven with a pulse having an opposite phase of the first phase, according to a specific embodiment. In other embodiments, the horizontal electrode in the area may be driven and the vertical electrodes in the area are used to measure mutual capacitance changes resulting from touches. Each area is then similarly driven and capacitance measurements are made, in sequence across the entire sensor.

In addition a similar circuit may be utilized for each sensing area (i.e., each group of horizontal and vertical detection electrodes). In addition or alternatively, multiplexors and the like may be utilized to switch the circuits described herein from one area to another so as to reduce redundancy in the circuitry.

Referring to FIG. 11, the circuit diagram 1100 includes a pulse generator 1105, a group of pulse drivers 1110a-d, an electrode circuit equivalent 1115, an integrator 1120, an analog-to-digital converter (ADC) 1125, a processor 1130, and a memory 1135.

The pulse generator is configured to generate a periodic waveform, such as, for example, a square wave pulse with a 50% duty cycle. Other examples of waveforms, such as those having a sinusoidal, saw tooth, triangular or different shape, may be generated and the duty cycle may be different. The frequency of the pulse may be on the order of several hundred kHz (e.g., 200 kHz). In some embodiments, the output of the pulse generator may not be a periodic waveform in that the frequency and duty cycle maybe varied. For example, to save power, the frequency may be decreased during low power modes of operations. The output of the pulse generator 1105 is coupled to the group of pulse drivers 1110a-d. The pulse generator 1105 may correspond to a separate circuit, such as a standalone oscillator. Alternatively, the pulse generator 1105 may correspond to an output of the processor 1130 configured to generate pulse waveforms.

Each pulse driver 1110a-d is configured to generate a first pulse that is in-phase with the pulse generated by the pulse generator 1105 and a second pulse that is 180° out-of-phase with the pulse generated by the pulse generator 1105. For example, the second pulse may be generated by passing the pulse generated by the pulse generator 1105 through an inverter.

In some embodiments, first and second outputs 1112ab of the pulse drivers may have floating and or grounded switch settings so that any linear combination of the mutual capacitances between a horizontal electrode 1210 and vertical electrodes, that is any linear combination of C1, C2, ... C8, may be measured and digitized by the ADC 1125. In other embodiments, optional gain elements (not shown) may be provided between the pulse generator 1105 and the switches so that linear combinations of combination of C1, C2, ... C8 can be weighted as g1*C1+g2*C2+g3*C3+ ... g8*C8, where g1, g2, ... g8 correspond to the inserted gains. In embodiments where the horizontal electrode 1210 is driven and the vertical electrodes are sensed, the variable gains g1, g2, ... g8 may be implemented as a variable gain element in the sense circuit upstream of the ADC 1125 or alternatively as multiplicative constants in the digital signal processing within a microprocessor. Such variable or programmable gains may be used to compensate for smaller values of mutual capacitances C3 and C4 relative to mutual capacitances C1 and C2 due to differences in distance between electrodes forming the mutual capacitances.

A selector 1114 of each pulse driver 1110a-d enables setting an output state of a respective pulse driver 1110a-d such that the first output 1112a is selectable to output one of the first and second pulses and the second output 1112b outputs the other pulse. For example, the first and second outputs 1112a and 1112b may output the first pulse and the second pulse, respectively, or vice versa. In some implementations, the selector 1114 may be configured to output the same signal to a given output 1112ab. For example, the selector may correspond to a 2-bit wide data line capable of 4 selection states for selectively outputting any combination of in-phase and out-of-phase signals to the first and second outputs 1112ab.

In the case of four pulse drivers 1110a-d, the output states of the pulse drivers 1110a-d may be collectively represented by a 4-bit binary number where the most significant bit, D3, represents the output state of a first pulse driver 1110a, D2 represents the output state of the second pulse driver 1110b, and so on. For example, a value of one (1) for a given pulse driver 1110a-d may indicate that the first output 1112a of a pulse driver 1110a-d is outputting an in-phase pulse and the second output 1112b is outputting an out-of-phase pulse. A value of zero (0) may indicate the opposite arrangement. The resulting binary number has sixteen different combinations. That is, in the case of four pulse drivers 1110a-d, there are sixteen combinations of pulse driver output states. It should be recognized that for illustration purposes there are four pulse drivers for a four-bit binary embodiment having four vertical electrode columns in the area, but a different number of pulse drivers and associated circuitry may be used in other embodiments such as when two electrodes within a column are both driven with the same phase or one or both electrodes are grounded.

The selectors 1114 of the respective pulse drivers 1110a-d may be controlled via corresponding outputs of the processor 1130. In some implementations, the selectors 1114 may be coupled to a 4-bit counter (not shown) configured to periodically cycle the pulse drivers 1110a-d through all sixteen combinations of output states. The respective pulse drivers 1110a-d may correspond to one or more discrete components coupled to the pulse generator 1105. Alternatively, the pulse drivers 1110a-d may correspond to outputs of the processor 1130.

The electrode circuit equivalent 1115 represents various capacitances formed between respective detection electrodes and from the detection electrodes to ground. Each of the capacitors 1122 labeled C9-C16 represents the self-capacitance of a corresponding vertical detection electrode, that is, the capacitance measured between the corresponding vertical detection electrode and a ground plane. Each of capacitors 1124a-h labeled C1-C8 represents the mutual capacitance between a corresponding vertical detection electrode and a horizontal detection electrode of an area. Each of capacitors C17-24 represents self-capacitance between the horizontal detection electrode and a ground plane.

Figure 12:
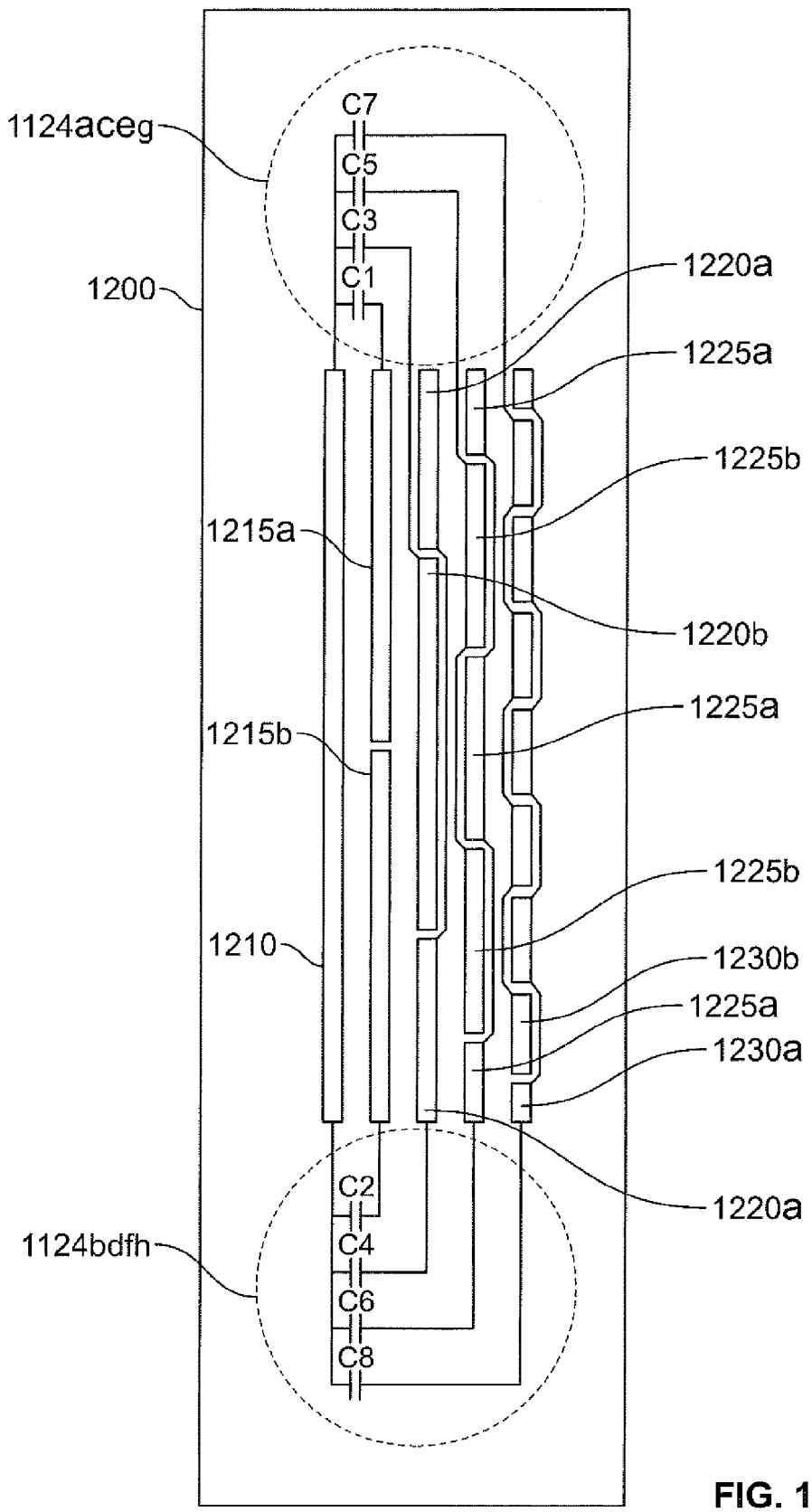
FIG. 12 illustrates the mutual capacitances of the electrode pattern of FIG. 6(a) that may be utilized according to a specific embodiment.

FIG. 12 illustrates the relationship between each of the mutual capacitances 1124a-h (C1-C8) and an exemplary electrode pattern 1200, which in this case corresponds to the electrode pattern of FIG. 6(a). However, the same principles apply to the other electrode patterns described herein. Referring to FIG. 12, the electrode pattern 1200 is divided into a group of detection electrodes arranged in non-overlapping columns for a given area. A first column comprises a horizontal detection electrode 1210. A second column comprises a first and a second vertical detection electrode 1215a and 1215b, which are electrically isolated from each other and electrically connected to different channels. Third, fourth, and fifth columns include electrode groups where vertical detection electrodes within a column are electrically connected via conductive traces in the electrode pattern. The third column comprises three vertical detection electrodes 1220a and 1220b. A first and third vertical detection electrode 1220a are electrically connected and positioned on either side of the second vertical detection electrode 1220b. The first and third vertical detection electrodes 1220a are electrically isolated from the second vertical detection electrode 1220b. Likewise, the fourth column includes two groups of vertical detection electrodes where every other vertical detection electrode in a given column belongs to one of the two groups 1225a and 1225b. Vertical detection electrodes from different groups 1225a and 1225b are electrically isolated. A fifth column includes an even greater number of vertical electrodes configured in two groups 1230a and 1230b, as described above. The number of vertical detection electrodes in a given column may be increased or decreased as needed depending on the desired resolution of the touch location.

Mutual capacitances 1124a (C1) and 1124b (C2) correspond to the capacitance between the horizontal detection electrode 1210 and the first and the second vertical detection electrodes 1215a and 1215b in the second column, respectively. Mutual capacitance 1124d (C4) corresponds to the capacitance between the horizontal detection electrode 1210 and the third and fourth vertical detection electrodes 1220a in the third column, and mutual capacitance 1124c (C3) corresponds to the capacitance between the electrode 1210 and the second vertical detection electrode 1220b in the third column.

Similarly, mutual capacitance 1124e (C5) corresponds to the capacitance between the horizontal detection electrode 1210 and the first group 1225b of vertical detection electrodes in the fourth column, and mutual capacitance 1124f (C6) corresponds to the second group 1225a of vertical detection electrodes in the fourth column. Mutual capacitance 1124g (C7) corresponds to the capacitance between the horizontal detection electrode 1210 and the first group 1230b of vertical detection electrodes in the fifth column, and mutual capacitance 1124h (C8) corresponds to the second group 1230a of vertical detection electrodes in the fifth column, respectively.

Generally, for N columns of vertical detection electrodes, there will be 2N such mutual capacitances; FIG. 12 illustrates the case where N is four (i.e., four columns) and there are eight mutual capacitances between one particular horizontal detection electrode and the eight vertical detection electrodes within a given area. It should be noted that the use of "vertical sensing" electrodes and "horizontal sensing" electrodes (as disclosed in U.S. application Ser. No. 12/780,077, filed May 14, 2010, incorporated by references above) is intended to be encompassed by the term "detection" electrode whether such electrode is "sensing" or "driving" or "measuring" according to the various embodiments (that is, the vertical sensing electrodes and horizontal sensing electrodes may be covered by the term "detection electrodes", in contrast to shield or guard electrodes that serve other purposes besides detection).

Returning to FIG. 11, the outputs 1112a and 1112b of the first pulse driver 1110a are coupled to the first and second vertical detection electrodes 1215a and 1215b in the first column, respectively. The outputs 1112a and 1112b of the second pulse driver 1110b are coupled to the first and third vertical detection electrodes 1220b in the third column, and the second vertical detection electrode 1220a, respectively. Similarly, the outputs 1112a and 1112b of the third pulse driver 1110c are coupled to the first group 1225b and second group 1225a of vertical detection electrodes in the fourth column, respectively. The outputs 1112a and 1112b of the fourth pulse driver 1110d are coupled to the first group 1230b and second group 1230a of vertical detection electrodes in the fifth column, respectively.

The horizontal detection electrode 1210 is coupled to a capacitance-to-voltage converter, such as an integrator circuit 1120 configured to integrate the current flowing through the various mutual capacitances 1124a-h formed between respective vertical detection electrodes and the horizontal detection electrode 1210, described below. An output of the integrator circuit 1120 is coupled to an analog-to-digital converter (ADC) 1125 that converts the analog output of the integrator circuit 1120 into a digital format, which enables the processor 1130 to analyze the output of the integrator circuit 1120.

The processor 1130 corresponds to any logic configured to perform a sequence of operations. The processor may correspond to a collection of state logic embedded within a gate-array integrated circuit or an application specific integrated circuit (ASIC). In addition or alternatively, the processor 1130 may include a central processing core (CPU) configured to perform a set of instructions stored in a non-transitory type of media such, such a computer memory 1135. The memory 1135 may correspond to a flash memory, random access memory (RAM), or a different type of memory.

Figure 13:
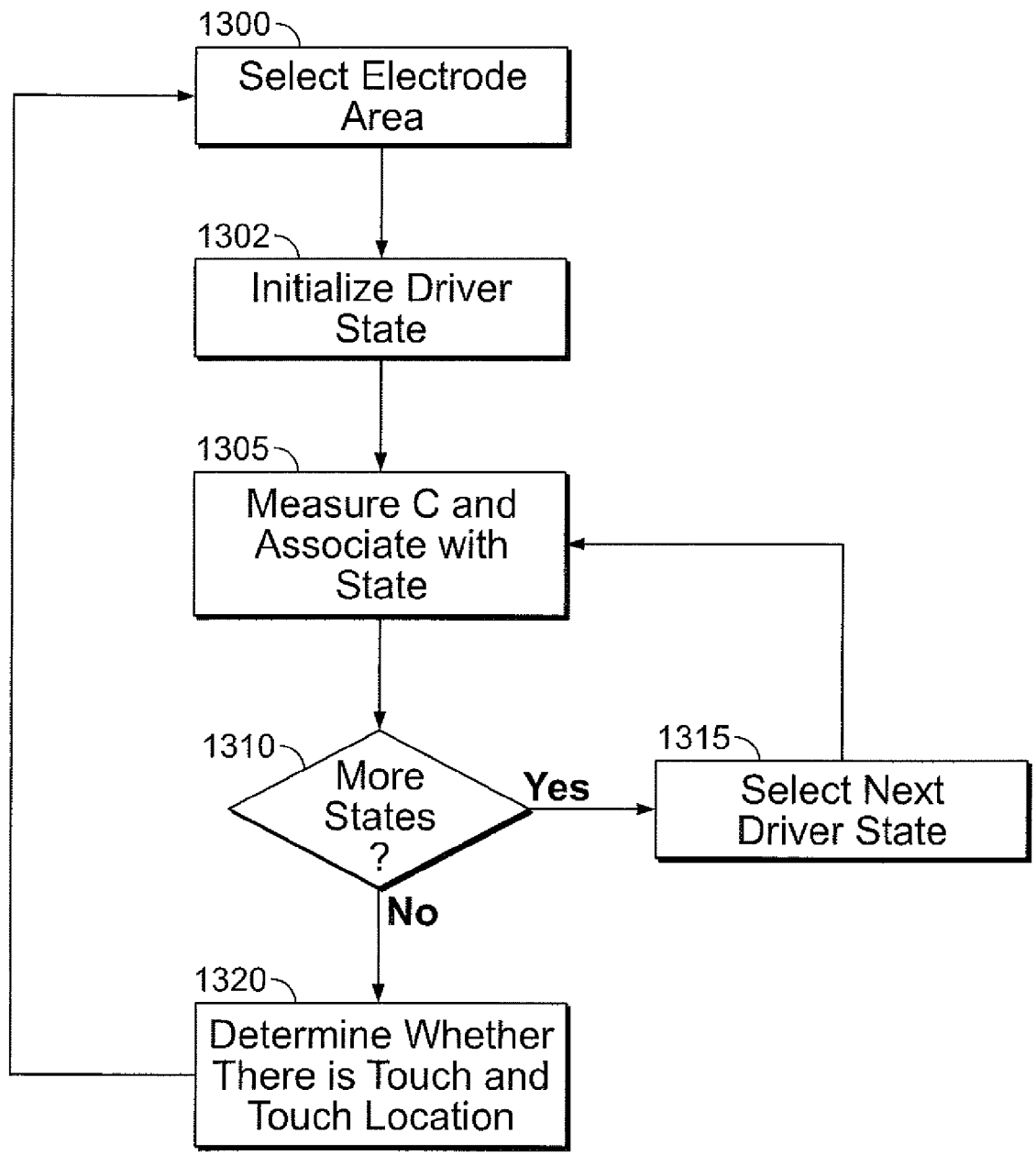
FIG. 13 illustrates exemplary operations of the conceptual circuit diagram of FIG. 11, according to specific embodiments.

FIG. 13 illustrates exemplary operations that enable determination of a touch location. These operations may be performed by the conceptual circuit diagram 1100 described above or different circuitry. Some or all of these operations may be represented in instruction code that causes a processor 1130 to perform all or a subset of these operations either alone or in conjunction with other circuitry and/or processors. In this regard, the instructions may be stored in any form of non-transitory types of media described herein (e.g., the memory 1135).

Referring to FIG. 13, at block 1300, a first electrode area is selected. As noted above, the electrode pattern may be divided into different non-overlapping areas where each area includes a horizontal detection electrode 1210 and vertical detection electrodes arranged in columns. Selection of an area may include switching the pulse drivers 1110a-d and/or the integrator circuit 1120 to respective electrodes within a selected area. In this regard, the processor 1130 may include one or more outputs coupled to selection logic for selecting a given area. Selection of one area at a time enables determining more than one touch location. In other words, multiple touches that span two or more different areas may be detected and the respective locations determined.

At block 1302, the pulse drivers 1110a-d are initialized to a known output state. The output states of the pulse drivers 1110a-d may be set according to the binary sequence 0000, where each bit corresponds to the output state of a given pulse driver 1110a-d, as described above.

At block 1305, the various mutual capacitances 1124a-h may be measured. In the exemplary embodiment, a combined capacitance of all the mutual capacitances 1124a-h associated with the various vertical detection electrodes in a given electrode area (i.e., an area that comprises a horizontal detection electrode and a group of vertical detection electrodes) may be measured simultaneously by measuring the current that flows through each mutual capacitor 1124a-h and through the horizontal detection electrode. This concept is illustrated in FIGS. 14(a)-14(c).

Figure 14A:
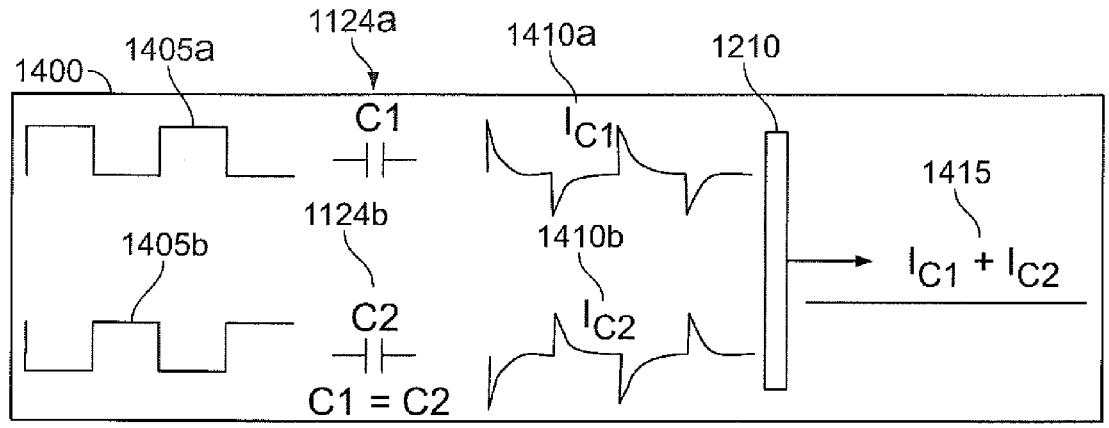
FIGS. 14(a)-14(c) illustrate the principles by which the mutual capacitance may be determined in accordance with a specific embodiment of the invention.
Figure 14B:
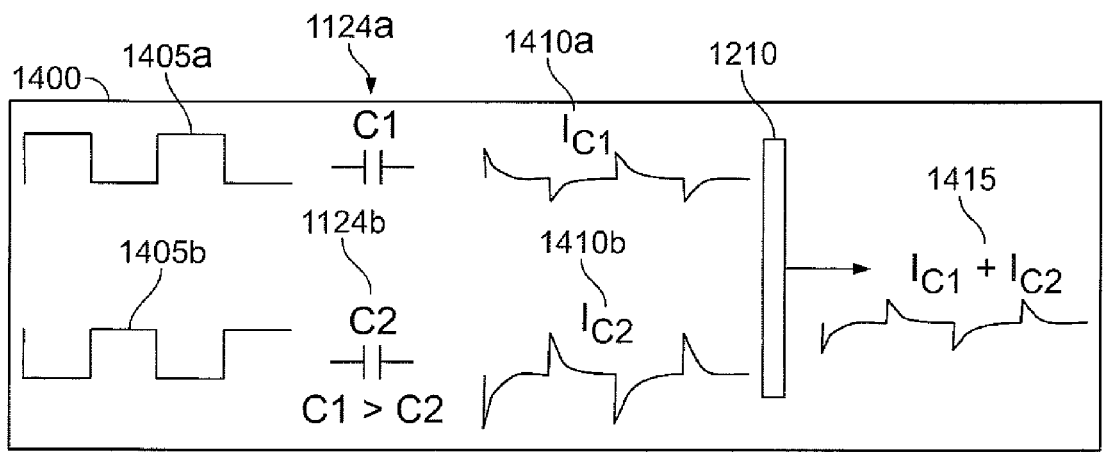
Figure 14C:
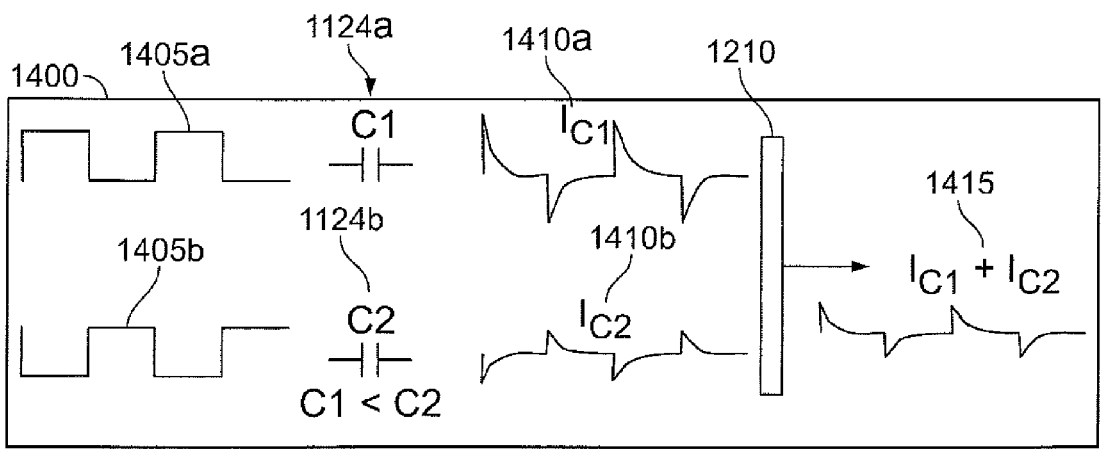

FIGS. 14(a)-14(c) illustrate the principles by which the mutual capacitance 1124a-h may be determined. For conciseness, these principles are described with reference to the first and second vertical detection electrodes 1215a and 1215b. However, these principles apply equally well to the other vertical detection electrodes, described above. Referring to FIG. 14(a), the pulse driver 1110a may be configured in a first output state (e.g., zero (0)) whereby the pulse driver 1110a outputs an in-phase pulse 1405a to the first vertical detection electrode 1215a and an out-of-phase pulse 1405b to the second vertical detection electrode 1215b. As described above, C1 1124a and C2 1124b correspond to the mutual capacitances between the first vertical detection electrode 1215a and the horizontal detection electrode 1210 and between the second vertical detection electrode 1215b and the horizontal detection electrode 1210, respectively. The pulses 1405a and 1405b cause a corresponding amount of current 1410a and 1410b to flow through the respective mutual capacitances 1124a and 1124b. The phases of the currents 1410a and 1410b are 180° out-of-phase with each other. In this example, the current flows 1410a and 1410b are equal in magnitude. Therefore, the combined current flow 1415 measured at the horizontal detection electrode 1210 will be zero. In reality, the respective currents will not be exactly the same and, therefore, some amount of current (i.e., "background current") may be measured. However, this current may be small in comparison to the measured current, or subtracted as a constant offset, when a touch occurs, as described below.

FIG. 14(b) illustrates the case where a touch occurs in proximity to the first vertical detection electrode 1215a. In this case, the mutual capacitance 1124a associated with the first vertical detection electrode 1215a decreases relative to the mutual capacitance 1124b of the second vertical detection electrode 1215b. This change produces a corresponding decrease in current 1410a that flows through the mutual capacitance 1410a of the first vertical detection electrode 1215a. That is, the current 1410a that flows through the first vertical detection electrode 1215a will be less than the current 1410b that flows through the second vertical detection electrode 1215b. In this case, a measurable difference in the combined current flow 1415 is detected at the horizontal detection electrode 1210. The combined current flow 1415 measured at the horizontal detection electrode 1210 is, therefore, out-of-phase with the pulse generated by the pulse generator 1105. In some embodiments, such as illustrated in FIG. 11, there is an inverting integrating amplifier 1120 before the ADC 1125 so that the digitized ADC value will increase when a touch occurs in proximity to the first vertical detection electrode 1215a. However, changing the output state of the pulse driver 1110a (e.g., from zero (0) to one (1)) will reverse the phase of the respective pulses 1405a and 1405b output from the pulse driver 1110a resulting in in-phase combined current flow 1415 measured at the horizontal detection electrode 1210 leading after inverting amplitude 1120 to a decreased digitized ADC value. In summary, a touch in proximity to detection electrode 1215a will increase the ADC value when pulse drive 1110a is set to zero (0) and decrease the ADC value when set to one (1) so the Y coordinate range of the first vertical detection electrode 1215a is associated with a binary bit value of zero (0).

FIG. 14(c) illustrates the opposite situation where the touch occurs in proximity to the second vertical detection electrode 1215b. In this case, the current 1410b that flows through the second vertical detection electrode 1215b is less than the current 1410a that flows through the first vertical detection electrode 1215a. For zero (0) setting of pulse driver 1110a, the phase of the combined current flow 1415 will match the phase of the pulse that is generated by the pulse generator 1105 and if there is inverting amplifier 1120 before the ADC 1125, the touch in proximity of the second vertical detection electrode 1215b will decrease the digitized ADC value. In contrast, for a one (1) setting of the pulse driver 1110a there will be in increase in the digitized ADC value. In summary, a touch in proximity to detection electrode 1215b will increase the ADC value when pulse drive 1110a is set to one (1) and decrease the ADC value when set to zero (0) so the Y coordinate range of the first vertical detection electrode 1215b is associated with a binary bit value of one (1).

The measurements described above are performed for all the vertical detection electrodes in the respective columns simultaneously. The respective pulse drivers 1110a-d simultaneously drive the vertical detection electrodes in all the columns of a given electrode area. For a given pulse driver output state, each pair of vertical detection electrodes in a given column will generate a net current flow to the horizontal detection electrode 1210 that is either in-phase or out-of-phase with the pulse generated by the pulse generator 1105. The respective net current flows are combined together at the horizontal detection electrode 1210. A unique combination of pulse driver output states results in a net current flow through the various vertical detection electrodes that maximized that resulting digitized ADC value. The binary bits of the unique combination of pulse driver output states are the binary bits that correspond to the vertical electrodes in close proximity to the touch.

Returning to block 1310, if there are additional output states to test, then at block 1315, the next combination of output states for the pulse drivers 1110a-d is selected. For example, if the previous output state combination corresponded to 0000, then the next output state combination may correspond to 0001. The process then repeats at block 1305 whereby the capacitance is measured for all sixteen output state combinations of the pulse drives 1110a-d.

If at block 1310 all the states have been tested, then at block 1320, a determination is made by the processor 1130 as to whether there is a touch in the selected area. For example, if the capacitance measurements of all the states are all at or below a background capacitance threshold, then a touch may not have occurred. On the other hand, if a given capacitance measurement is above the background capacitance threshold, then a touch has occurred. The touch location may be determined by determining the pulse driver state that resulted in the maximum measured capacitance and determining the electrode location associated with the determined state. After determining whether a touch has occurred, and if so, a touch location, a next electrode area is selected and the process continues at block 1300 until the process has occurred for each electrode area in the touch sensor.

Figure 15:
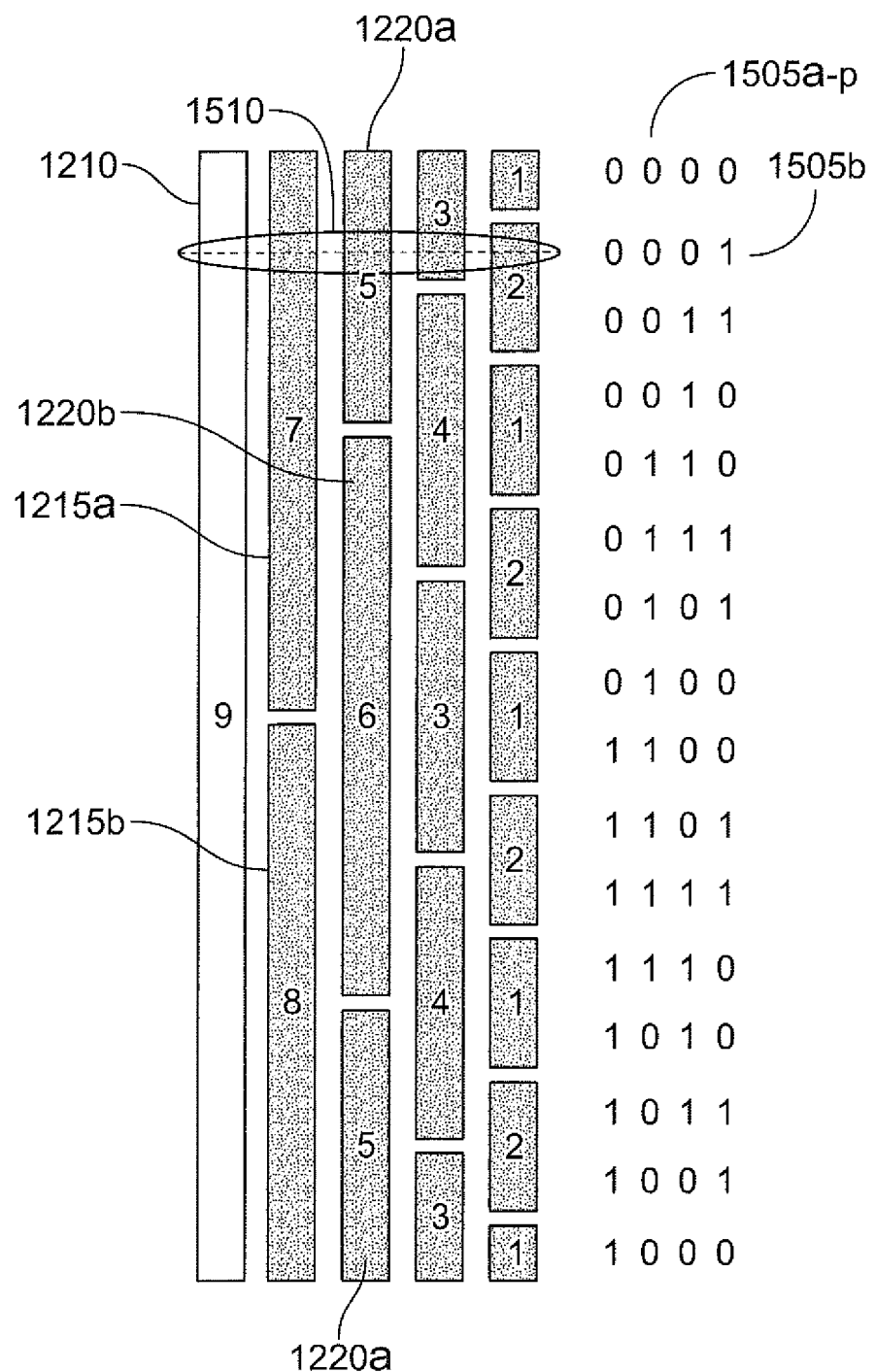
FIG. 15 illustrates the determination of a touch location in accordance with a specific embodiment of the invention.

The operations described above are better understood with reference to FIG. 15. Referring to FIG. 15, a touch 1510 occurs over the electrodes in a given area. In this case, the touch 1510 is in proximity to the horizontal detection electrode 1210 labeled 9, and vertical detection electrodes labeled 7, 5, 3, and 2. An output state representation 1505a-p of possible contact locations is shown next to the electrodes. Each bit in the output state representation represents a phase of a pulse driver 1110a-d. For example, the left most or most significant bit represents the phase of the first pulse driver 1110a, the next bit (bit 3) represents the phase of the second pulse driver 1110b, and so on. The bit value indicates the phase. For example, a zero (0) indicates that the output state of the pulse driver 1110a coupled to the first vertical detection electrode 1215a in the second column is in-phase with the output of the pulse generator 1105. A one (1) indicates that the output state of the pulse driver 1110a coupled to the first vertical detection electrode 1215b is out-of-phase with the output of the pulse generator 1105.

A touch 1510 that occurs at a given location will result in a maximum ADC value of measured capacitance when the pulse drivers are configured according to the output state pattern associated with the touch location. For example, in this case, the touch 1510 would result in a maximum ADC value of measured capacitance when the pulse drivers 1110a-d are set according to the output state pattern 0001 1505b. This pattern indicates that the first, second and third pulse drivers 1505a-c are outputting an in-phase pulse to electrodes labeled 7, 5, and 3, and out-of-phase pulses to electrodes labeled 8, 6, and 4. The fourth pulse driver 1505d is outputting an out-of-phase pulse to the electrode labeled 1 and an in-phase pulse to the electrode labeled 2. In other words, the vertical detection electrodes in the proximity of the touch 1510 are all being driven by a pulse that is in-phase with the pulse generated by the pulse generator 1105. This combination (i.e., all in-phase pulses) results in a maximum ADC value of measured capacitance and subsequent determination of the touch location.

Figure 16A:
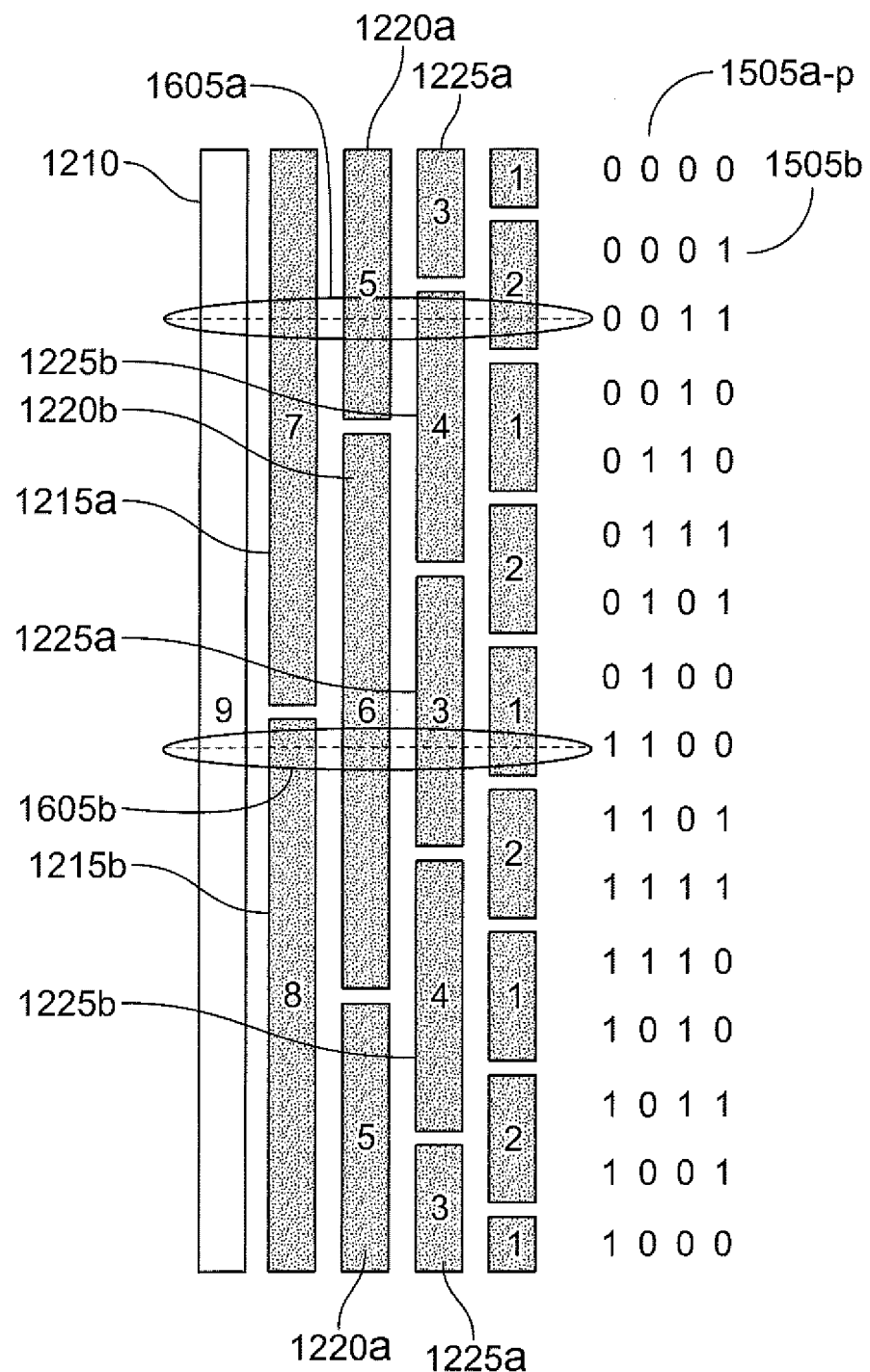
FIGS. 16(a) and 16(b) illustrate multiple touch locations within a vertical column in accordance with a specific embodiment of the invention.

FIG. 16(a) illustrates the case when two touches, touch A 1605a and touch B 1605b, have different Y coordinates but the same X coordinate. That is, the respective touches are within proximity to the same horizontal electrode 1210, but different vertical electrodes. Touch A 1605a has a Y position associated with the code 0011. Touch B 1605 is associated with the code 1100. The presence of touch A 1605a results in changes to mutual capacitances C1, C4, C5 and C7 of FIG. 12 and does not change the remaining mutual capacitances for C2, C3, C6 and C8. If touch B 1605b were not present, this pattern of changed mutual capacitances would reveal the Y binary code 0011 and hence the Y coordinate of touch A 1605a. If touch B 1605b is present, but touch A 1605a is not present, then mutual capacitances C2, C3, C6 and C8 would be changed rather than mutual capacitances C1, C4, C5 and C7. However, if both touches 1605a and 1605b are present at the same time, all capacitances C1, C2, . . . C8 will be changed. If the touches are of equal strength and the circuit above includes gains g1, g2, . . . g8 to equalize sensitivity for all mutual capacitances, the change in the measured mutual capacitances C1, C2, . . . C8 will all be the same. The same result is obtained if touch A 1605a and touch B 1605b are at positions corresponding to Y codes of 0000 and 1111, or 0001 and 1110, or any other pair of codes that are logical complements of each other. Thus there is an eightfold ambiguity in the interpretation of a vertical dual touch resulting in equal signals for mutual capacitances C1, C2, . . . C8. More generally, if touch A 1605a and touch B 1605b correspond to Y binary codes for which M bits are logical complements, there is a $2^{M-1}$ fold ambiguity. When values of the mutual capacitances C1, C2, . . . C8 are ambiguous in their interpretation, i.e. there are two or more different ways to locate a pair of vertical dual touches results in the same measured values, it is difficult to remove the ambiguity simply by measuring or computing linear combinations of the values of C1, C2, . . . C8, as is done by the circuit shown in FIG. 11. Allowing touch A 1605a and touch B 1605b to have different strengths adds an additional degree of complexity leading to more ambiguity in the interpretation of mutual capacitance measurements between horizontal and vertical electrodes. It should be noted, however, that any ambiguity associated with the vertically aligned touches 1605a and 1605b does apply to other touches that are in different columns.

Figure 16B:
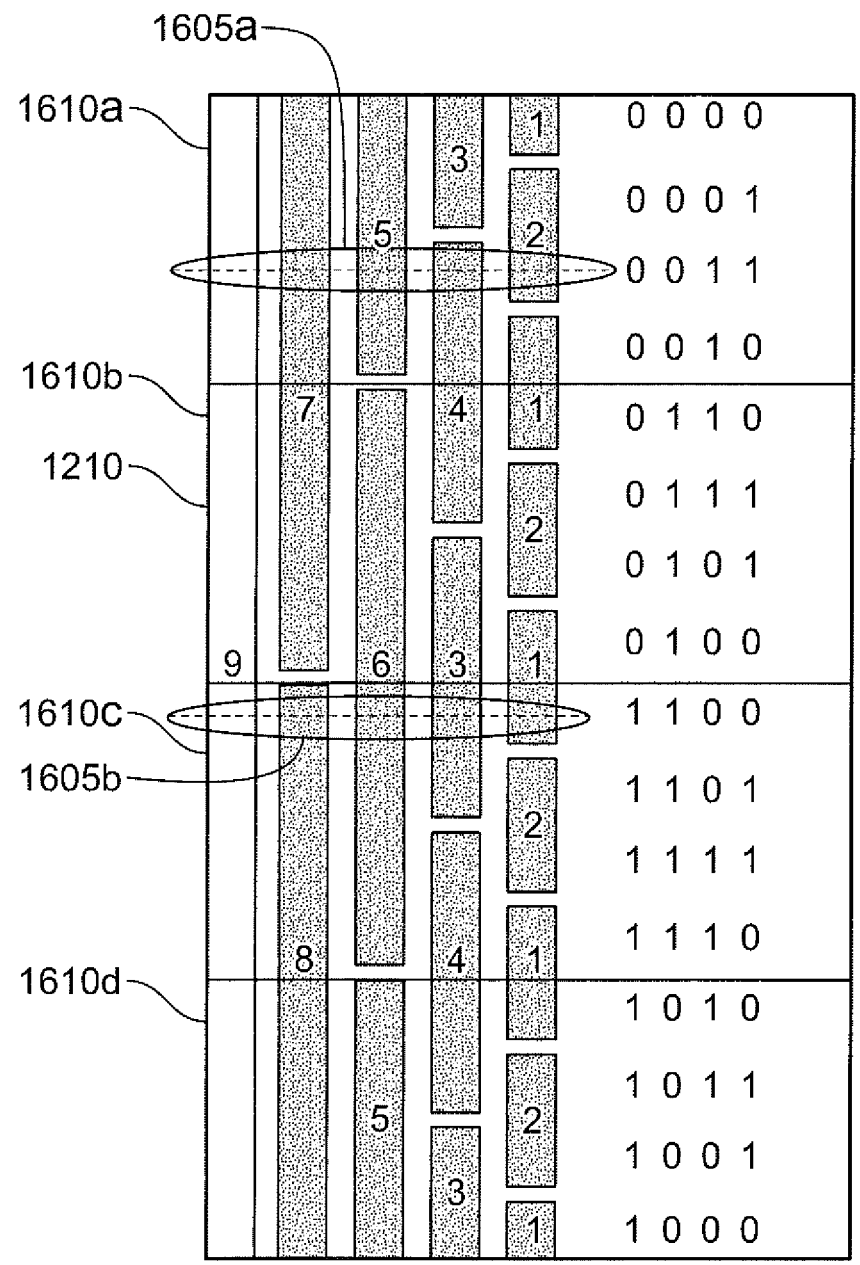

One approach to resolve the ambiguity above involves measuring mutual capacitances between pairs of vertical electrodes, and in particular between pairs of vertical electrodes in different columns. Let $C_{j,k}$ and $\Delta C_{j,k}$ be the mutual capacitance and the touch induced change of mutual capacitance, respectively, between vertical electrode j and vertical electrode k. Consider again the case of vertically aligned touch A 1605a and touch B 1605b corresponding to Y binary codes 0011 and 1100. Touch A 1605a alone results in a non-zero value for touch signal in a non-zero value $\Delta C_{7,5}$, but zero values for $\Delta C_{7,6}$, $\Delta C_{8,5}$ and $\Delta C_{8,6}$. Touch B 1605b alone results in a non-zero value for touch signal in a non-zero value $\Delta C_{8,6}$, but zero values for $\Delta C_{7,5}$, $\Delta C_{7,6}$, and $\Delta C_{8,5}$. When touch A 1605a and touch B 1605b are present at the same time, $\Delta C_{7,5}$ and $\Delta C_{8,6}$ have non-zero values and $\Delta C_{7,6}$ and $\Delta C_{8,5}$ are zero values. The non-zero values of $\Delta C_{7,5}$ and $\Delta C_{8,6}$ indicate that one touch overlaps the horizontal electrode 1210 with a code of the form 00xx where "x" represents a code digit that can equal 0 or 1, and a second touch overlaps the horizontal electrode 1210 with a code of the form 11xx. The zero values of values for $\Delta C_{7,6}$ and $\Delta C_{8,5}$ indicate that no touch overlaps the horizontal electrode 1210 with codes of the form 01xx and 10xx where "x" represents a code digit that can equal 0 or 1. This partially eliminates the vertical dual touch ambiguity by revealing that there is one touch in the top quarter 1610a of the touch area and another touch in the second-to-the-bottom quarter 1610c of the touch area and no touches in either the bottom quarter 1610d of the touch area and the second-from-top-quarter 1610b of the touch area, as illustrated in FIG. 16(b). Similarly, measurements of mutual capacitances corresponding to the next pair of vertical electrode columns, namely $\Delta C_{5,3}$, $\Delta C_{5,4}$, $\Delta C_{6,3}$ and $\Delta C_{6,4}$ allow a determination that there are touches corresponding to Y binary codes of the form x01x and x10x but not of the form x00x or x11x. By repeating this analysis for mutual capacitances between all pairs of vertical electrode columns, sufficient information is generated to unambiguously determine the Y binary codes of touch A 1605a and touch B 1605b and thus resolve the dual vertical touch ambiguity problem.

The presence of the interconnecting traces, such as those shown in FIGS. 10 and 12, add a degree of complexity. For example, a touch overlapping electrode 1220b (electrode 6 in FIG. 6(a)) and electrode 1225a (electrode 3 in FIG. 6(a)) will also lead to changes in mutual capacitance between electrode 1220b (electrode 6 in FIG. 6(a)) and electrode 1225b (electrode 4 in FIGS. 6(a) and 12) due to the interconnecting trace between segments of electrodes 1225b and likewise the interconnecting trace between segments of electrode 1220a (electrode 5 in FIGS. 6(a) and 12) will result in a non-zero change in mutual between electrode 1220a (electrode 5) and electrode 1225a (electrode 3). Such effects may be represented by the following equation:

$$\Delta C_{j,k} = \sum_j \sum_k M_{j,k,l,m} \cdot T_{l,m}$$

where $T_{l,m}$ is the strength of the touch overlapping electrodes l and m, and $M_{j,k,l,m}$ is a matrix of coefficients relating touch strengths $T_{l,m}$ to measured mutual capacitance changes $\Delta C_{j,k}$. In the ideal case, $M_{j,k,l,m}$ is a diagonal matrix with non-zero elements only when j=l and k=m. The interconnecting traces shown in FIGS. 10 and 12 complicate matters by introducing non-zero off-diagonal elements in the matrix of coefficients $M_{j,k,l,m}$. In simplified matrix notation, the above equation can be written as follows, where $\Delta C$ is a vector with components $\Delta C_{j,k}$, T is a vector with components $T_{l,m}$, and M is a matrix with elements $M_{j,k,l,m}$:

$$\Delta C = M \cdot T$$

The matrix elements $M_{j,k,l,m}$ may be determined by measurements, simulation or other methods. Let $M^{-1}$ be the inverse of the matrix M. Then the above equation may be inverted to the form:

$$T = M^{-1} \cdot \Delta C$$

or more explicitly in index notation as follows:

$$T_{j,k} = \sum_j \sum_k M^{-1}_{j,k,l,m} \cdot \Delta C_{l,m}$$

For the non-ideal case in which the matrix M is not diagonal, the measured mutual capacitances $\Delta C_{j,k}$ may first be transformed to touch signals $T_{j,k}$ corresponding to the more idealized case, and then proceeding with the above described methods applied to the correct touch signals $T_{j,k}$ rather than the raw measured mutual capacitances $\Delta C_{j,k}$. In the above equations, the range of the indices may also include the horizontal electrodes, so that the formalism is not limited to use with mutual capacitances between vertical electrodes. In this fashion, the mutual capacitance effects of interconnecting traces can be accounted for.

Figure 17A:
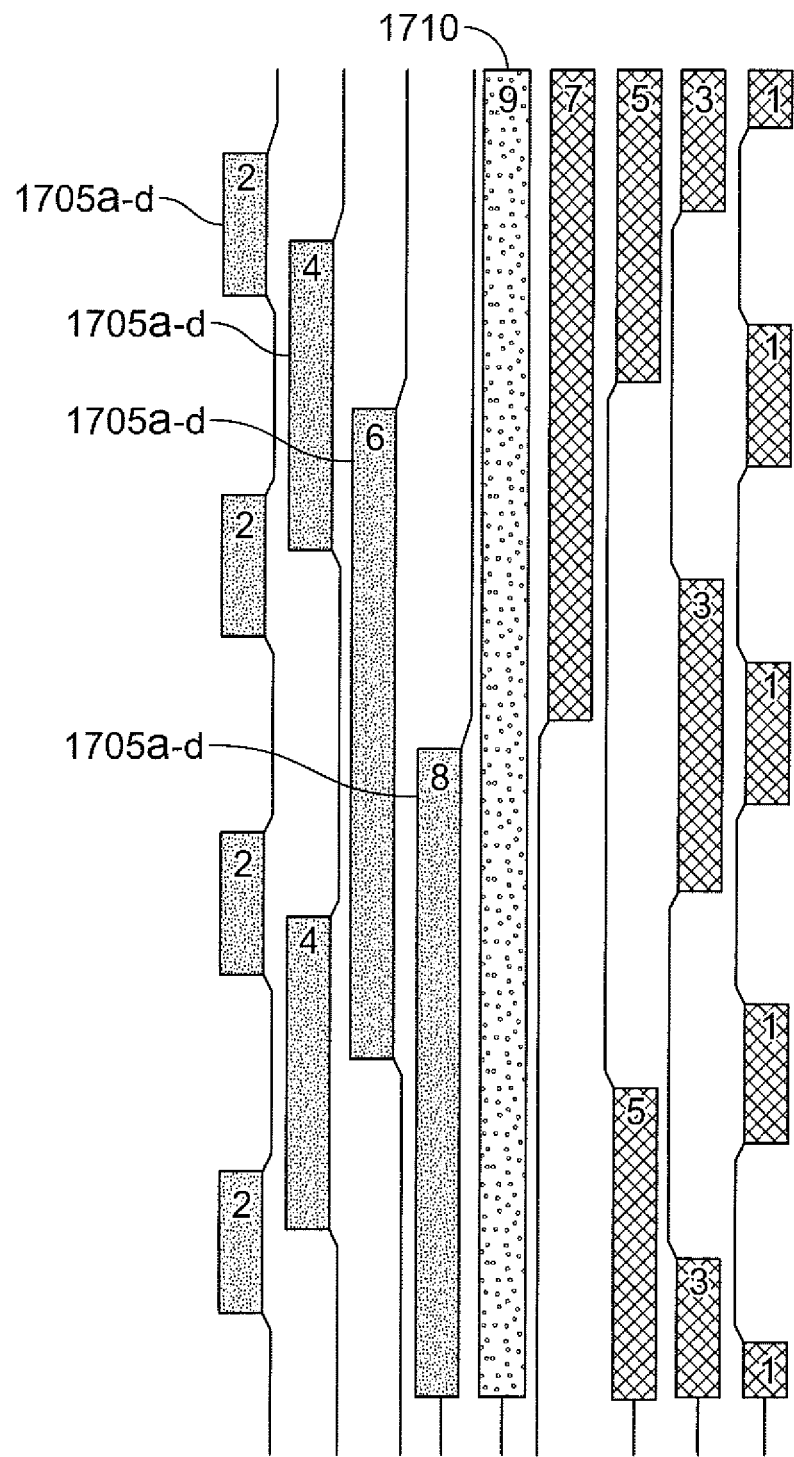
FIGS. 17(a), 17(b), and 17(c) illustrate an alternative detection electrode pattern formed according to a specific embodiment of the invention.
Figure 17B:
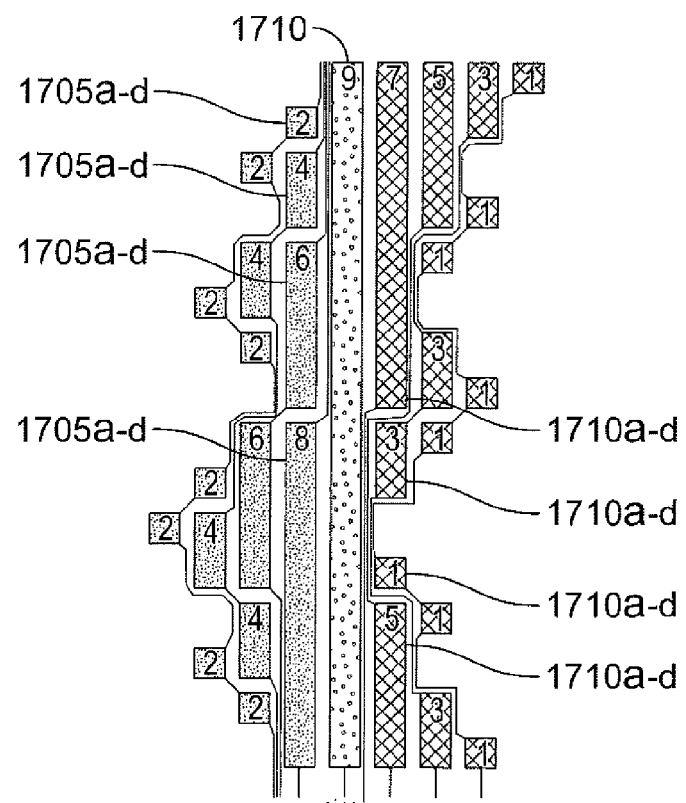
Figure 17C:
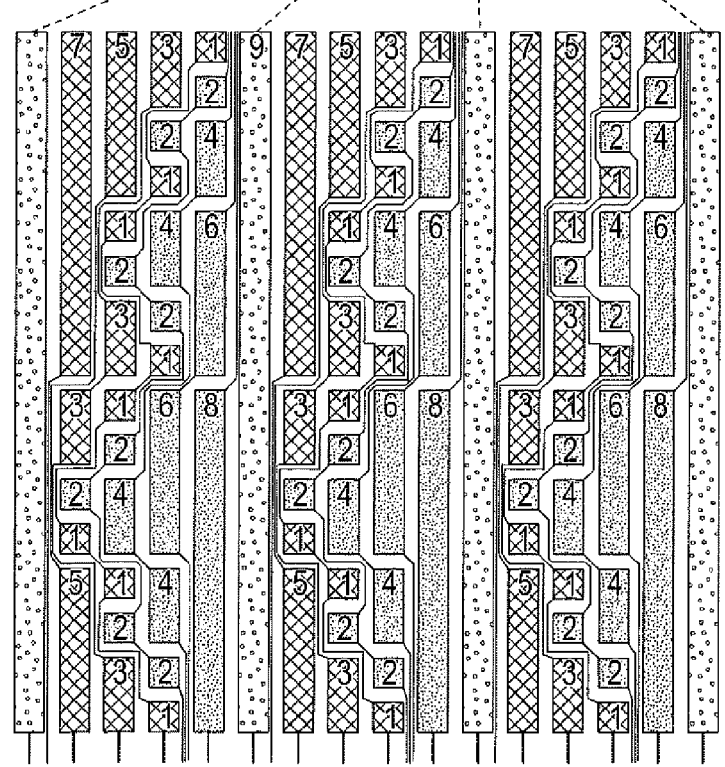

Referring to FIG. 6(a), in the absence of a touch, mutual capacitances may be unbalanced in the following sense. In column 464 electrodes 404 (7) and 406 (8) have a mutual capacitance with respect to electrode 402 (9) of $C_{7,9}$ and $C_{8,9}$ respectively. It would be desirable to balance these two mutual capacitances so that $C_{7,9} = C_{8,9}$ so that if electrodes 7 and 8 are driven with opposite polarities, for example with circuitry shown in FIG. 11, no mutual capacitance signal is sensed at electrode 402 (9). However, for example, the interconnect line 444 from electrode 404 (7) that passes between electrodes 406 (8) and 402 (9) increases the mutual capacitance between electrodes 404 (7) and 402 (9) so that $C_{7,9}$ is larger than $C_{8,9}$. Likewise, mutual capacitances between electrodes 408 (5) and 410 (6) relative to electrode 402 (9) are imbalanced; that is $C_{5,9}$ differs from $C_{6,9}$. Similarly, this is the case for mutual capacitances between electrode 402 (9) and electrodes in columns 468 and 470. In some embodiments, such imbalances may be corrected by various offset corrections in either the electronic hardware or in software. However, in other embodiments, such as shown in FIGS. 17(a) to 17(c), the detection electrode pattern is designed to balance the no-touch mutual capacitances associated with a horizontal electrode (such as electrode 402 (9)) and the pair of electrodes in each column of the vertical electrodes. By minimizing offsets and corresponding corrections, improved signal-to-noise and dynamic range performance may be provided in such embodiments.

In FIGS. 17(a) and 17(b), vertical detection electrodes 1705a-d labeled 8, 6, 4 and 2 are moved to the left of the horizontal detection electrode 1710 labeled 9. In FIG. 17(a), the electrode pattern is not compressed horizontally. In FIGS. 17(b) and 17(c), the pattern is compressed horizontally to minimize dead space even when that means pads of a given electrode are no longer confined a perfectly aligned vertical column and electrode pads are sometimes sheared and split. This altered electrode geometry with respect to FIG. 6(a) allows the balancing of mutual capacitances so that $C_{1,9}=C_{2,9}$, $C_{3,9}=C_{4,9}$, $C_{5,9}=C_{6,9}$ and $C_{7,9}=C_{8,9}$. The jagged left and right boundaries seen in FIG. 17(b) may at first appear to be a problem. However note that the shape of the left boundary is complementary to the shape of the right boundary so that the pattern can be easily tiled to fill the desired touch area (with the vertical detection electrodes 1705a-d labeled 8, 6, 4, 2 dropped for the extreme left tile and vertical detection electrodes 1710a-d labeled 7, 5, 3, 1 dropped from the extreme right tile), as illustrated in FIG. 17(c). As discussed above, the number of vertical detection zones may based on a number of pairs of vertical detection electrodes. For example, FIGS. 17(a) to 17(c) also illustrate four pairs of vertical detection electrodes (a pair of vertical detection electrodes labeled 8,7; a pair of vertical detection electrodes labeled 6,5; a pair of vertical detection electrodes labeled 4,3; and a pair of vertical detection electrodes labeled 2,1). In the embodiments shown in FIGS. 17(a) to 17(c), the four pairs of vertical detection electrodes yield sixteen vertical detection zones in an area. Again, the number of vertical detection zones within which a touch may be detected equals $2^P$, where P equals the number of pairs of vertical detection electrodes in a given area (shown in FIG. 17(b). In the embodiments of FIGS. 17(a) to 17(c), the vertical detection electrodes in a given pair are not aligned in the same column (e.g., as in FIG. 5), but may be in different columns. Following similar principles other balanced binary detection electrode patterns may be provided in other embodiments.

It is to be understood that the above description is intended to be illustrative, and not restrictive. For example, the above-described embodiments (and/or aspects thereof) may be used in combination with each other. Different circuit configurations may be utilized to determine a touch location. For example, the conceptual circuit described above may operate in an opposite manner whereby the horizontal detection electrode is driven by a pulse generator and current measurements are taken from the vertical detection electrodes. The mutual capacitance may be measured differently. For example, the mutual capacitance differences (C1-C2), (C3-C4), (C5-C6) and (C7-C8) may be measured in several ways. Eight mutual capacitances C1, C2, C3, C4, C5, C6, C7 and C8 may be individually measured and digitized and then the differences in (C1-C2) etc. may be computed in microprocessor software. Individual mutual capacitances may be measured by connecting a horizontal detection electrode 1210 to a drive circuit, such as the drive circuit 1110a in FIG. 11 and by connecting the selected vertical detection electrode (one of 1215 1220, 1225, 1230a or b) to a sensing circuit, such as the sensing circuit 1120 1125 in FIG. 11. Alternatively, the drive circuit could be connected to the selected Y electrodes and the sense circuit connected to the horizontal electrode 1210. It is also an option to perform the differences in mutual capacitances in analog electronics as is shown in FIG. 11 (which is explained in more detail below).

Figure 2A:
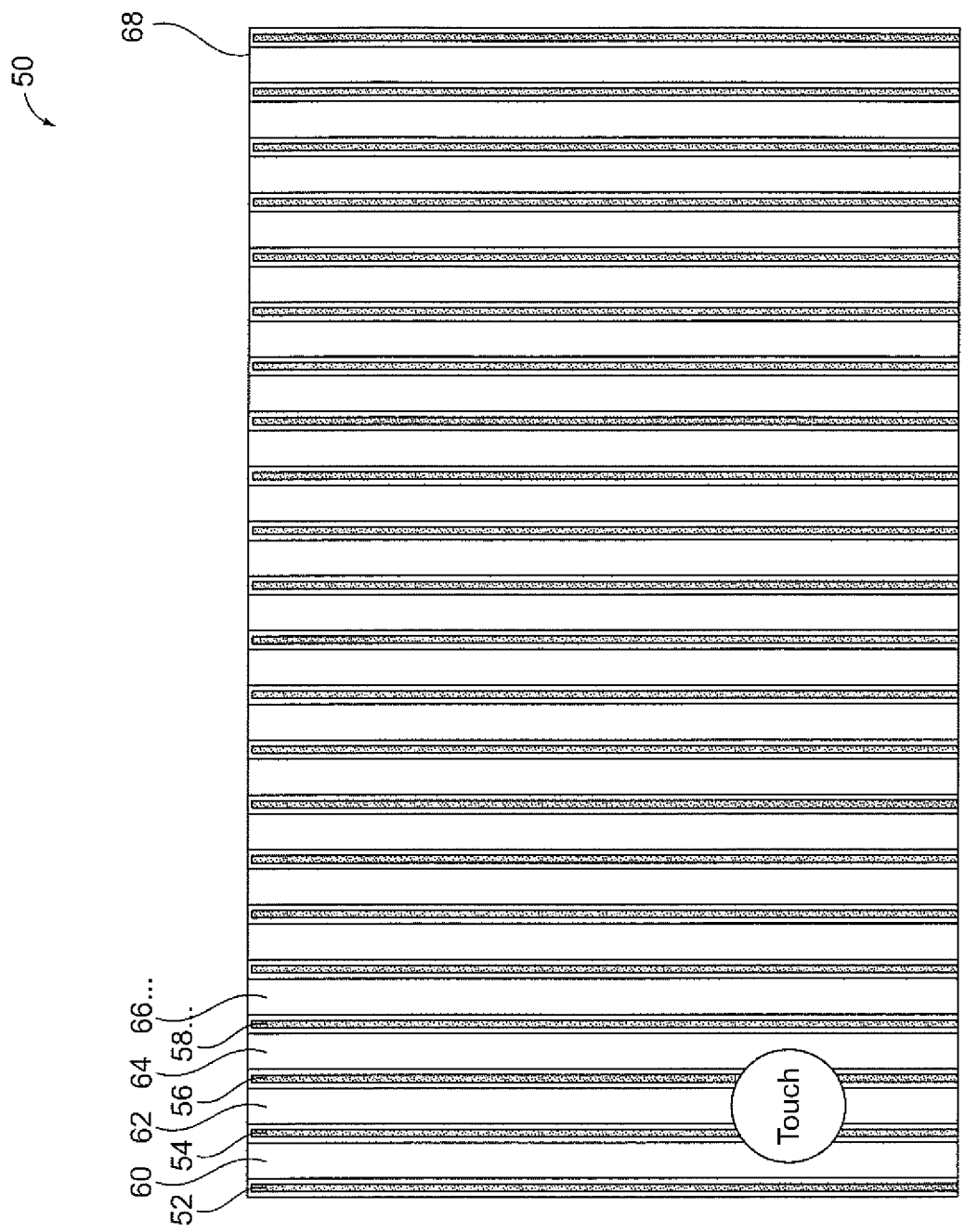
FIGS. 2(a) and 2(b) illustrate a touch sensor wherein vertical and horizontal detection electrodes are formed in a single plane on a surface of a touch sensor, in accordance with embodiments of the present invention.
Figure 2B:
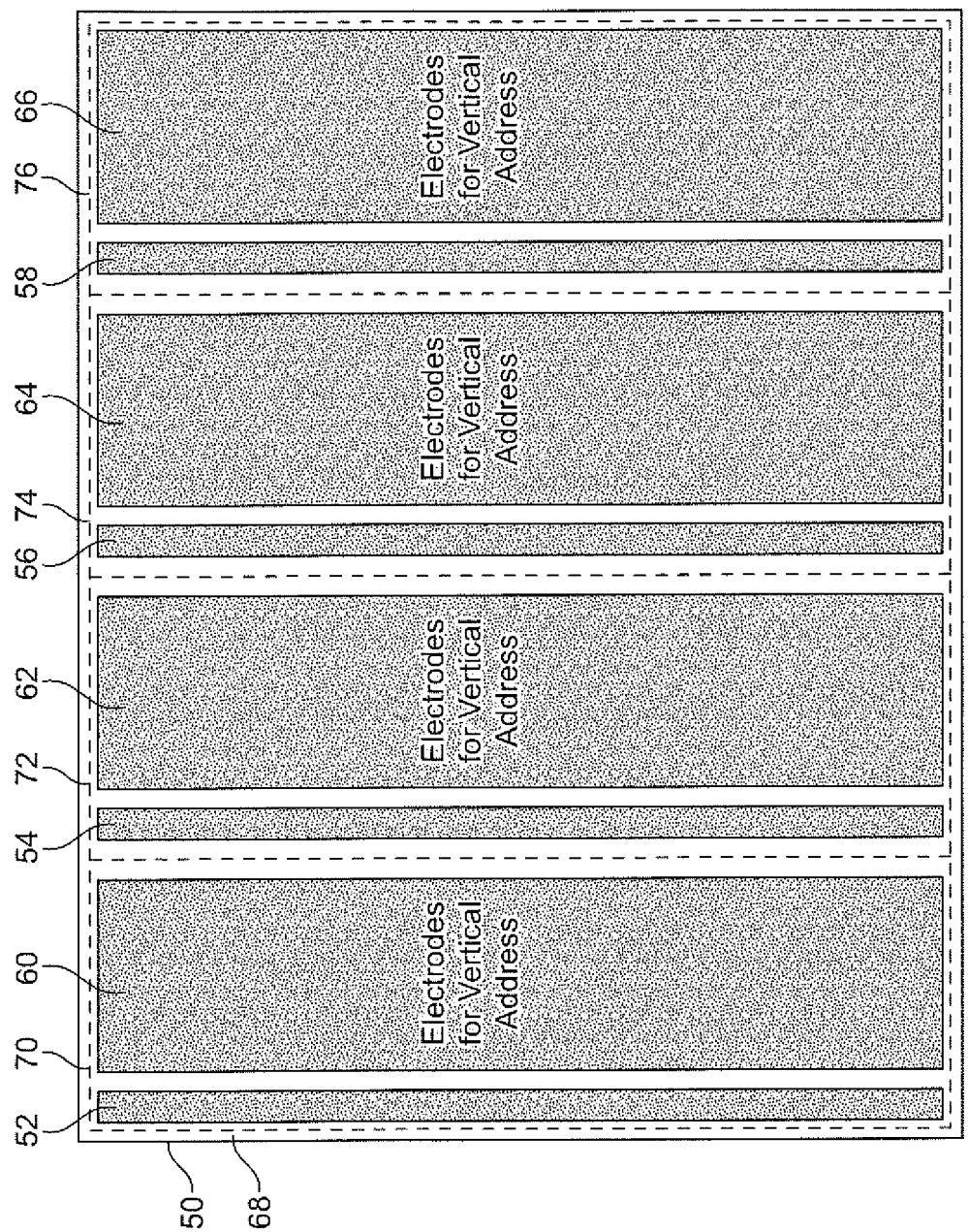
Figure 18:
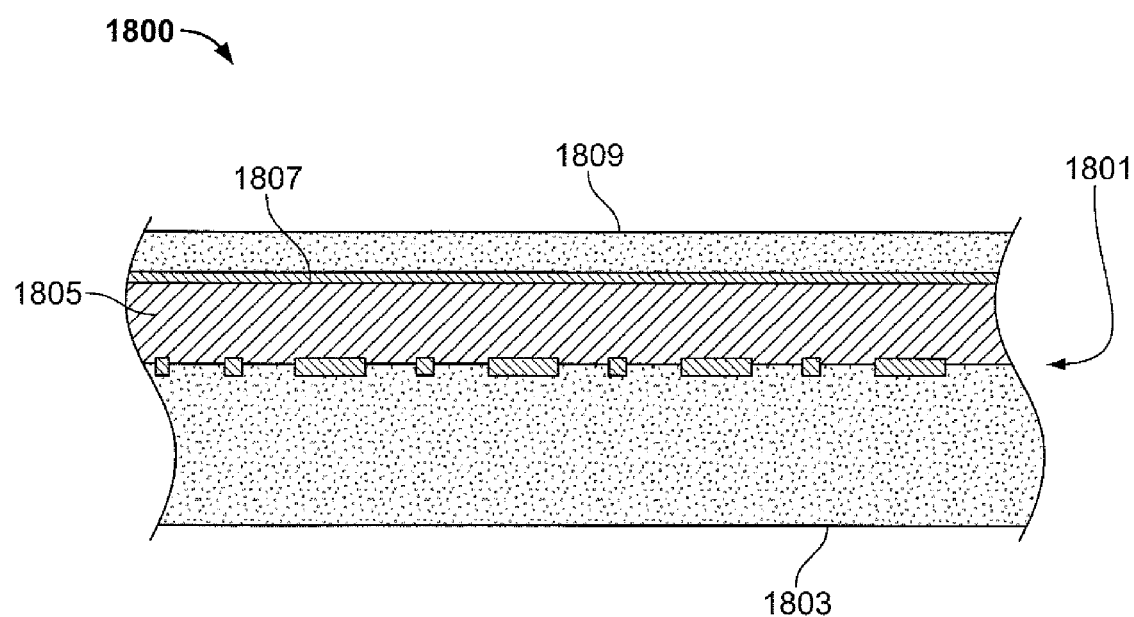
FIG. 18 is a cross-sectional detail of the stack up of a piezo-resistive variant of a binary touch input system, according to a still further specific embodiment of the invention.

To enable X coordinate measurement of single touches in some embodiments, each horizontal electrode, such as electrode 1210, may be provided with its own separate electronic channel. For example, multiple instances of the circuit of FIG. 11 may be coupled to respective horizontal electrodes, such as the horizontal electrodes 52, 54, 56, 58 etc. of FIG. 2(a). To minimize circuitry costs, in some embodiments, there may be a common set of electronic channels for all vertical electrode regions 60, 62, 64, 66 etc. of FIG. 2(a); in the case illustrated in FIG. 11 switching circuits 1110a, 1110b, 1110c and 1110d are sufficient to drive the entire touch area shown in FIG. 2(a). Further, use of binary electrode patterns, such as illustrated in FIGS. 2(a) and 6(a), need not be limited to capacitance sensing input devices according to further specific embodiments. As seen in FIG. 18, which is a cross-sectional detail of the stack up of a piezo-resistive variant of a binary touch input system 1800, according to a specific embodiment. For example, the binary detection electrodes 1801 could be formed of patterned indium tin oxide (ITO) or other suitably transparent conductive material on a substrate 1803 made of glass, or formed by conductive copper traces on substrate 1803 of an insulating glass reinforced epoxy laminate sheet, such as FR4, where the electrode pattern 1801 is no different than for the capacitive embodiments discussed above. However, instead of an insulating dielectric layer above the detection electrodes 1801 as in the capacitive embodiments, a layer of piezo-resistive material 1805 is provided above and in electrical contact with the detection electrodes 1801. Optionally, a ground electrode 1807 may be included above and in electrical contact with the piezo-resistive layer 1805. Like the detection electrodes, this ground electrode 1807 may be formed of ITO, carbon nanotubes, silver nanowires or any other conductive material. To provide a durable, scratch resistant touch surface, a top touch surface layer 1809 may be included. The touch surface layer 1809 could be polyester film such polyethelene terephthalate (PET) film, optionally provided with a hardcoat, a thin layer of glass, or a more complex structure with additional functionality such as a display (e.g., an electrophoretic display or an OLED (organic light emitting diode) display). However it is required that the touch surface layer 1809 has sufficient flexibility so that a touch on the touch surface layer results in pressure being applied to the piezo-resistive material layer 1805. Piezo-resistive material 1805, which may be transparent or opaque, is a material whose electric resistance changes when pressure is applied. Examples of a piezo-resistive material 1805 are the quantum tunneling composite (QTC) material developed by Peratech as described for example in U.S. Pat. No. 7,196,358, or as described in U.S. Published Patent Application 2009/0237374.

With appropriate electronics, the piezo-resistive binary input device 1800 can be operated in either self-resistive mode or mutual resistive mode in analogy to the self-capacitive and mutual-capacitive modes of the binary electrode pattern operation described above. In self-resistive mode, resistance is measured between a selected electrode and ground (either the optional ground electrode in the sketch above or other electrodes which are temporarily grounded). In mutual-resistive mode, resistance is measured between pairs of selected electrodes; in this case, for example, the mutual capacitances C1, C2, . . . C8 shown in FIG. 12 of in connection with capacitive embodiment would be replaced by mutual resistances R1, R2, . . . R8. Resistances are measured before any touch activity and after a touch. Circuits for measuring resistance are well known and will not be discussed here. Changes in resistance provide a touch signal that is processed in a manner similar to changes in capacitance in capacitive embodiments.

In addition, many modifications may be made to adapt a particular situation or material to the teachings of the invention without departing from its scope. This written description uses examples to disclose the invention, including the best mode, and also to enable any person skilled in the art to practice the invention, including making and using any devices or systems and performing any incorporated methods. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A method for determining a touch location of a projected capacitive touch sensor, comprising:
providing a substrate with a plurality of non-overlapping areas, wherein each non-overlapping area includes a horizontal detection electrode in a first column and a second column with a plurality of vertical detection electrodes;
measuring a first mutual capacitance between the horizontal detection electrode and a vertical detection electrode from the plurality of vertical detection electrodes;
measuring a second mutual capacitance between the horizontal detection electrode and another vertical detection electrode from the plurality of vertical detection electrodes;
determining one or more horizontal detection electrode and vertical detection electrode combinations based on a change in the first mutual capacitance and the second mutual capacitance;
determining a digitized capacitance value based on the change in the first and the second mutual capacitances; and
determining the touch location based on a location of the one or more determined horizontal detection electrode and vertical electrode combinations and the digital capacitance value.

2. The method according to claim 1, further comprising:
selecting each of the plurality of non-overlapping areas individually; and
determining whether a touch has occurred in each selected area and a touch location within the selected area, whereby selection of each area individually enables detection of more than one simultaneous touch location.

3. The method according to claim 1, wherein the horizontal detection electrodes in different areas of the plurality of non-overlapping areas are electrically disconnected with respect to each other and the plurality of vertical detection electrodes.

4. The method according to claim 1, wherein:
measuring the first mutual capacitance further comprises driving the vertical detection electrode from the plurality of vertical detection electrodes with a first pulse to generate a first current flow through the first mutual capacitance; and
measuring the second mutual capacitance further comprises simultaneously driving the another vertical detection electrode from the plurality of vertical detection electrodes with a second pulse to generate a second current flow through the second mutual capacitance, wherein the second pulse has a same first shape as the first pulse and is 180 degrees out-of-phase with the first pulse.

5. The method according to claim 4, further comprising:
measuring, at the horizontal detection electrode, a combined current flowing through the first mutual capacitance and the second mutual capacitance.

6. The method according to claim 4, wherein the substrate includes a third column with a plurality of vertical detection electrodes, the method further comprising:
measuring a third mutual capacitance by driving a vertical detection electrode from the plurality of vertical detection electrodes in the third column with a third pulse to generate a third current flow through a third mutual capacitance formed between the vertical detection electrode from the plurality of vertical detection electrodes in the third column and the horizontal detection electrode; and
measuring a fourth mutual capacitance by simultaneously driving another vertical detection electrode from the plurality of vertical detection electrodes in the third column with a fourth pulse to generate a fourth current flow through a fourth mutual capacitance formed between the another vertical detection electrode from the plurality of vertical detection electrodes in the third column and the horizontal detection electrode, wherein the third pulse has a same second shape as the fourth pulse and is 180 degrees out-of-phase with the fourth pulse.

7. The method according to claim 6, wherein the first shape of the first and the second pulses match the second shape of the third and the fourth pulses and the phase of the third pulse matches the phase of one of the first and the second pulses.

8. The method according to claim 7, wherein the phase of the first pulse is either 0° or 180°, and the phase of the third pulse either 0° or 180°, and further comprising:
selecting all combinations of phases of the first pulse and the second pulse; and
for each combination, measuring a combined current flow through the first, second, third, and fourth mutual capacitances.

9. The method according to claim 8, further comprising:
determining a pulse driver state associated with a combination of phases for which a maximum combined current flow is measured; and
determining a substrate location associated with the pulse driver state.

10. The method according to claim 1, further comprising:
measuring a mutual capacitance between at least two vertical detection electrodes from the plurality of vertical detection electrodes.

11. The method according to claim 1, wherein the substrate includes a third column with a plurality of vertical detection electrodes, the method further comprising:
measuring a third mutual capacitance between the horizontal detection electrode and a vertical detection electrode from the plurality of vertical detection electrodes in the third column;
measuring a fourth mutual capacitance between the horizontal detection electrode and another vertical detection electrode from the plurality of vertical detection electrodes in the third column; and
determining the digital capacitance value based on the change in the third mutual capacitance and the fourth mutual capacitance.

12. The method according to claim 11, wherein:
the determining the one or more horizontal detection electrode and vertical detection electrode combinations is based on the third and the fourth mutual capacitances; and
the determining the touch location is based on the digital capacitance value.

13. The method according to claim 11, wherein at least two of the vertical detection electrodes from the plurality of vertical detection electrodes in the third column are electrically connected.

14. The method according to claim 1, wherein at least two of the vertical detection electrodes from the plurality of vertical detection electrodes in the second column are electrically connected.

15. A touch sensor system, comprising:
a substrate with a plurality of non-overlapping areas, wherein each non-overlapping area includes a horizontal detection electrode in a first column and a second column with a plurality of vertical detection electrodes;
a measuring circuit configured to measure a first mutual impedance between the horizontal detection electrode and a vertical detection electrode from the plurality of vertical detection electrodes and to measure a second mutual impedance between the horizontal detection electrode and another vertical detection electrode from the plurality of vertical detection electrodes; and
processing logic configured to:
determine one or more horizontal detection electrode and vertical detection electrode combinations based on a change in the first mutual impedance and the second mutual impedance;
determine a digitized capacitance value based on the change in the first and the second mutual impedances; and
determine the touch location based on a location of the determined horizontal detection electrode and vertical electrode combinations and the digital capacitance value.

16. The system according to claim 15, wherein the processing logic is further configured to determine a change in mutual resistance.

17. The system according to claim 15, wherein the processing logic is further configured to determine a change in mutual capacitance.

18. The system according to claim 15, further comprising:
a selector configured to select each of the plurality of non-overlapping areas individually; and
wherein the processing logic is configured to determine whether a touch has occurred in each selected area and a touch location within the selected area, whereby selection of each area individually enables detection of more than one simultaneous touch locations.

19. The system according to claim 15, wherein the horizontal detection electrodes in different areas of the plurality of non-overlapping areas are electrically disconnected with respect to each other and the plurality of vertical detection electrodes.

20. The system according to claim 15, wherein the measuring circuit further comprises a first pulse driver circuit that comprises:
a first output configured to drive the vertical detection electrode from the plurality of vertical detection electrodes with a first pulse to generate a first current flow through a first mutual capacitance; and
a second output configured to simultaneously drive the another vertical detection electrode from the plurality of vertical detection electrodes with a second pulse to generate a second current flow through a second mutual capacitance, wherein the second pulse has a same first shape as the first pulse and is 180 degrees out-of-phase with the first pulse.

21. The system according to claim 20, further comprising:
an integrator circuit configured to measure, at the horizontal detection electrode, a combined current flowing through the first mutual capacitance and the second mutual capacitance.

22. The system according to claim 21, further comprising:
a plurality of vertical detection electrodes in a third column; and
a second pulse driver circuit that comprises:
a third output configured to drive a vertical detection electrode of the plurality of vertical detection electrodes in the third column with a third pulse to generate a third current flow through a third mutual capacitance formed between the vertical detection electrode of the plurality of vertical detection electrodes in the third column and the horizontal detection electrode; and
a fourth output configured to simultaneously drive another vertical detection electrode of the plurality of vertical detection electrodes in the third column with a fourth pulse to generate a fourth current flow through a fourth mutual capacitance formed between the another vertical detection electrode of the plurality of vertical detection electrodes in the third column and the horizontal detection electrode, wherein the third pulse has a same second shape as the fourth pulse and is 180 degrees out-of-phase with the third pulse.

23. The system according to claim 22, wherein the first shape of the first and the second pulses match the second shape of the third and the fourth pulses and the phase of the third pulse matches the phase of one of the first and the second pulses.

24. The system according to claim 23, wherein the phase of the first pulse is either 0° or 180°, and the phase of the third pulse either 0° or 180°, and further comprising:
selection logic configured to select all combinations of phases of the first pulse and the second pulse; and for each combination, the measuring circuit is configured to measure a combined current flow through the first, second, third, and fourth mutual capacitances.

25. The system according to claim 24, wherein the processing logic is further configured to determine a pulse driver state associated with a combination of phases for which a maximum combined current flow is measured, and determine a substrate location associated with the pulse driver state.

26. A touch sensor system, comprising:
a substrate with a plurality of non-overlapping areas, where each non-overlapping area includes a plurality of detection electrodes, the plurality of detection electrodes configured in at least three columns and including:
a horizontal detection electrode in a first column;
P pairs of vertical detection electrodes that are electrically isolated from one another, wherein P is at least 2, and wherein the P pairs of vertical detection electrodes define (2*P) non-overlapping vertical detection zones in the area, a second column comprising at least one pair of vertical detection electrodes and a third column comprising at least one pair of vertical detection electrodes;
a controller configured to measure a first mutual capacitance between the horizontal detection electrode and a vertical detection electrode in the pair of vertical detection electrodes in the second column, and configured to measure a second mutual capacitance between the horizontal detection electrode and another vertical detection electrode in the pair of vertical detection electrodes in the second column; and
processing logic configured to:
determine horizontal detection electrode and vertical detection electrode combinations based on a change in the first mutual capacitance and the second mutual capacitance;
determine a digitized capacitance value based on the change in the first mutual capacitance and the second mutual capacitance; and
determine a touch location based on a location of the horizontal detection electrode and vertical electrode combinations and the digitized capacitance.

27. The touch sensor system according to claim 26, wherein the controller is further configured to select each of the plurality of non-overlapping areas individually and to determine whether a touch has occurred in each selected area and, if so, a touch location within the selected area, whereby selection of each area individually enables detection of more than one simultaneous touch locations.

28. The touch sensor system according to claim 26, where the controller is further configured to measure the first mutual capacitance by driving the vertical detection electrode in the pair of vertical detection electrodes in the second column with a first pulse to generate a first current flow through the first mutual capacitance, and by simultaneously driving the another vertical detection electrode in the pair of vertical detection electrodes in the second column with a second pulse to generate a second current flow through the second mutual capacitance, wherein the second pulse has a same first shape as the first pulse and is 180 degrees out-of-phase with the first pulse.

29. The touch sensor system according to claim 26, wherein the controller is further configured to measure a fifth mutual capacitance between at least one vertical detection electrode in the second column and at least one vertical detection electrode in the third column.

\* \* \* \* \*